(12) United States Patent
Kim et al.

(10) Patent No.: US 11,399,433 B2
(45) Date of Patent: Jul. 26, 2022

(54) DISPLAY DEVICE

(71) Applicant: Samsung Display Co., Ltd., Yongin-Si (KR)

(72) Inventors: Wontae Kim, Hwaseong-si (KR); Jae-Han Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/199,723

(22) Filed: Mar. 12, 2021

(65) Prior Publication Data
US 2022/0022318 A1 Jan. 20, 2022

(30) Foreign Application Priority Data

Jul. 14, 2020 (KR) .......................... 10-2020-0086859

(51) Int. Cl.
*H05K 1/11* (2006.01)
(52) U.S. Cl.
CPC ............. *H05K 1/117* (2013.01); *H05K 1/118* (2013.01); *H05K 2201/094* (2013.01); *H05K 2201/10128* (2013.01)
(58) Field of Classification Search
CPC .. H05K 1/117; H05K 1/118; H05K 2201/094; H05K 2201/10128

USPC ......................................................... 361/749
See application file for complete search history.

(56) References Cited

U.S. PATENT DOCUMENTS 9,761,560 B2  9/2017 Lee et al.

FOREIGN PATENT DOCUMENTS

JP          4214357 B2    1/2009
KR    1020160043571 A    4/2016

*Primary Examiner* — Tremesha S Willis
(74) *Attorney, Agent, or Firm* — Cantor Colburn LLP

(57) ABSTRACT

A display device includes a display panel including first and second signal pads respectively disposed at one side and the other side of a center axis extending in a first direction and first and second fixing pads spaced apart from each other with the first and second signal pads interposed therebetween, and a flexible film including connection pads overlapping the signal pads and first and second alignment pads groups spaced apart from each other with the connection pads interposed therebetween. The first alignment pad group includes n first alignment pads arranged in the first direction, the second alignment pad group includes n second alignment pads corresponding to the first alignment pads, and a distance between corresponding first and second alignment pads decreases as a distance thereof from a display area decreases.

18 Claims, 19 Drawing Sheets

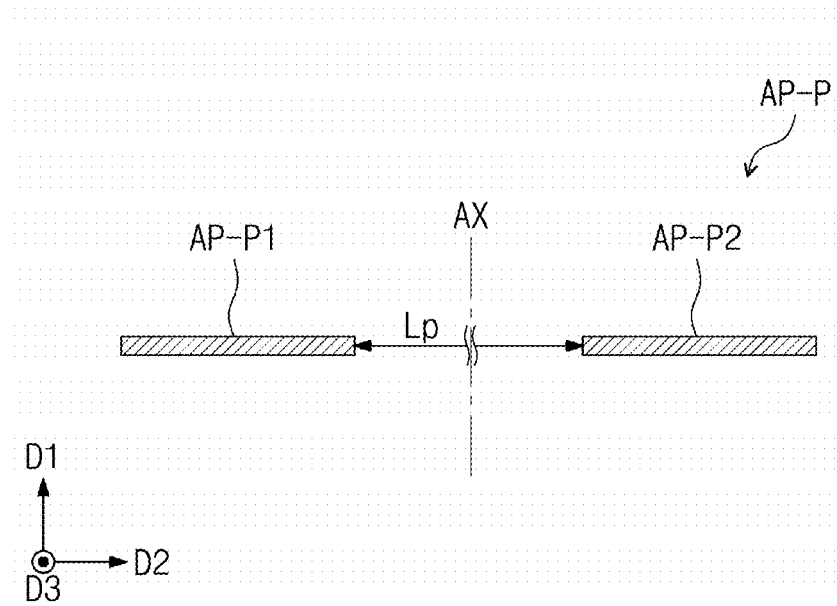

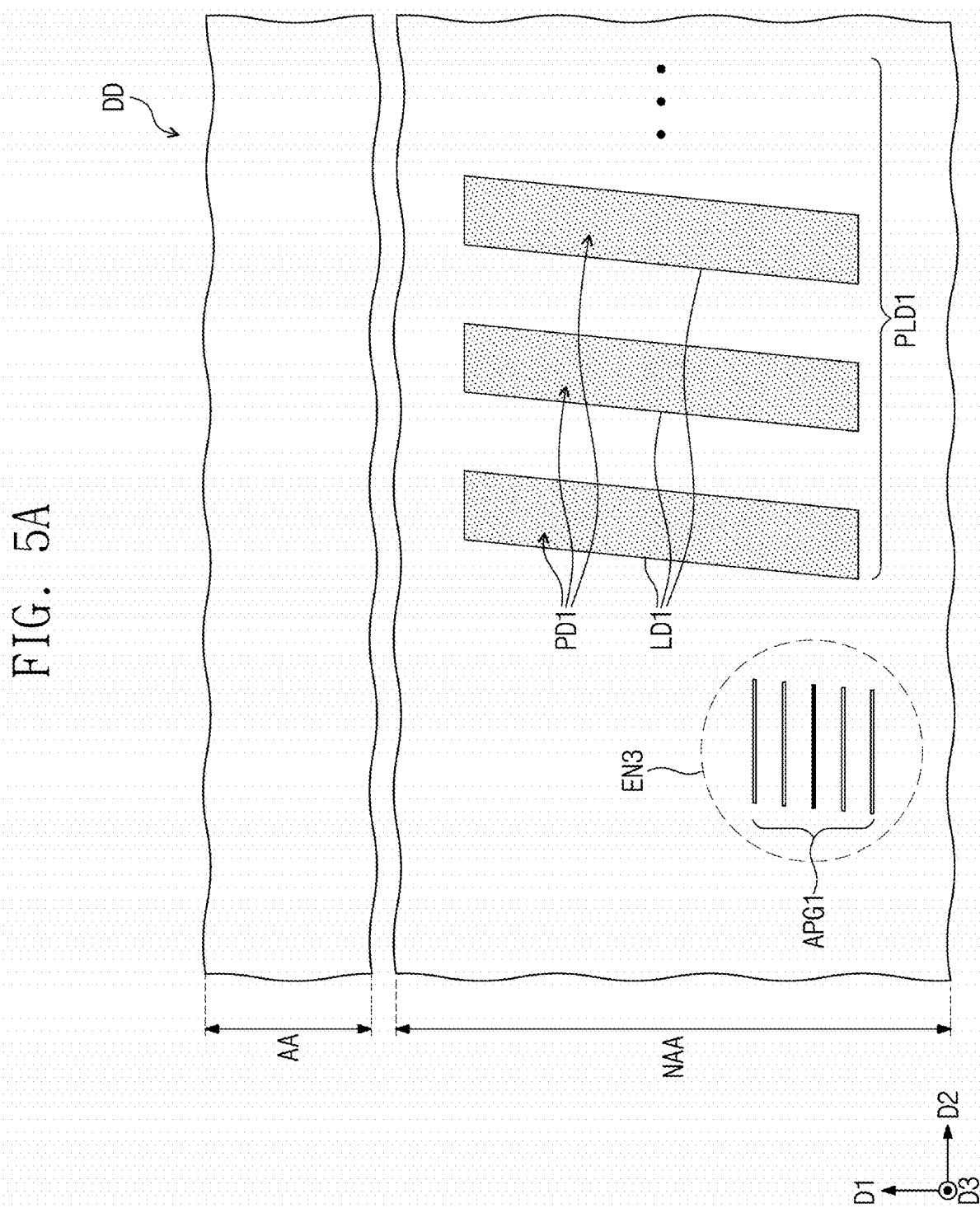

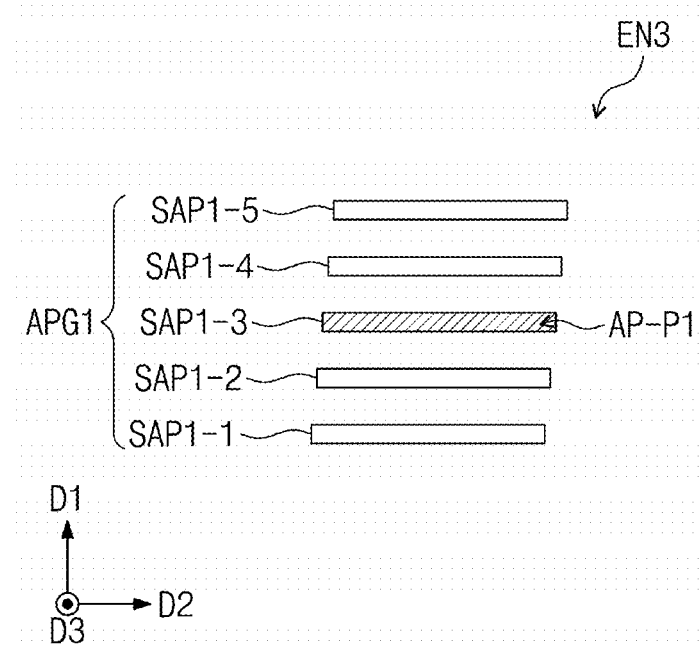

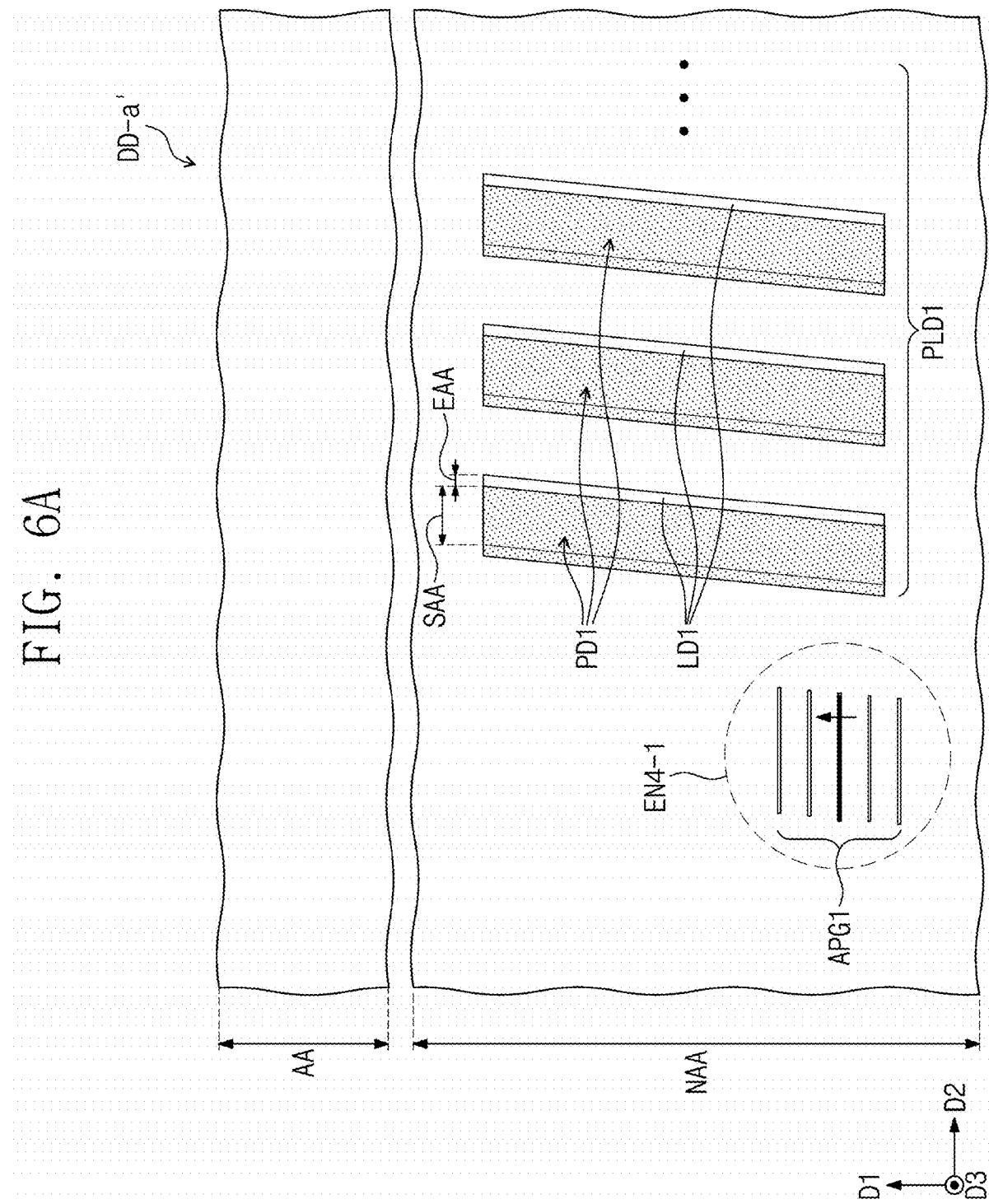

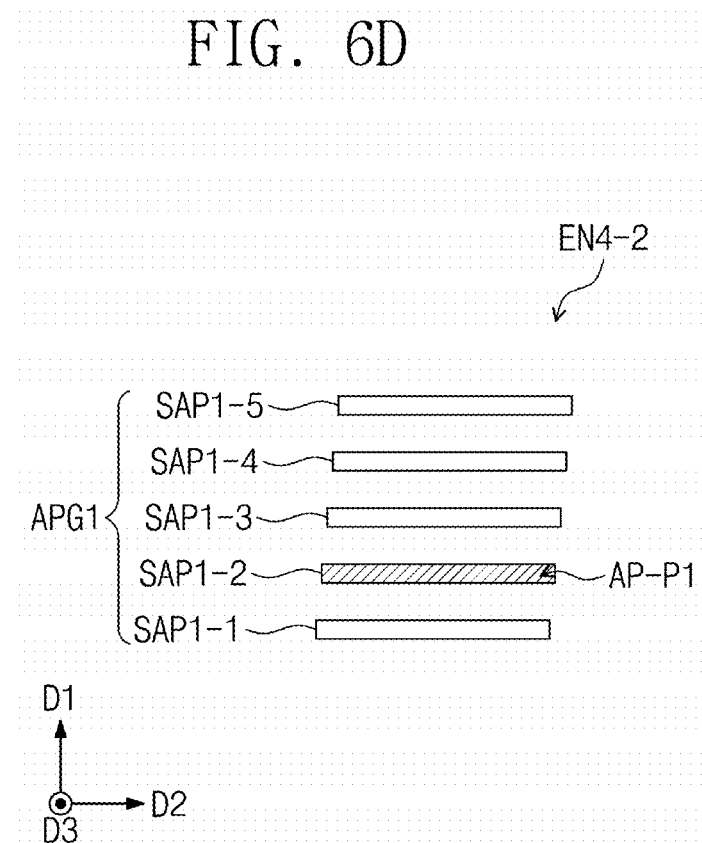

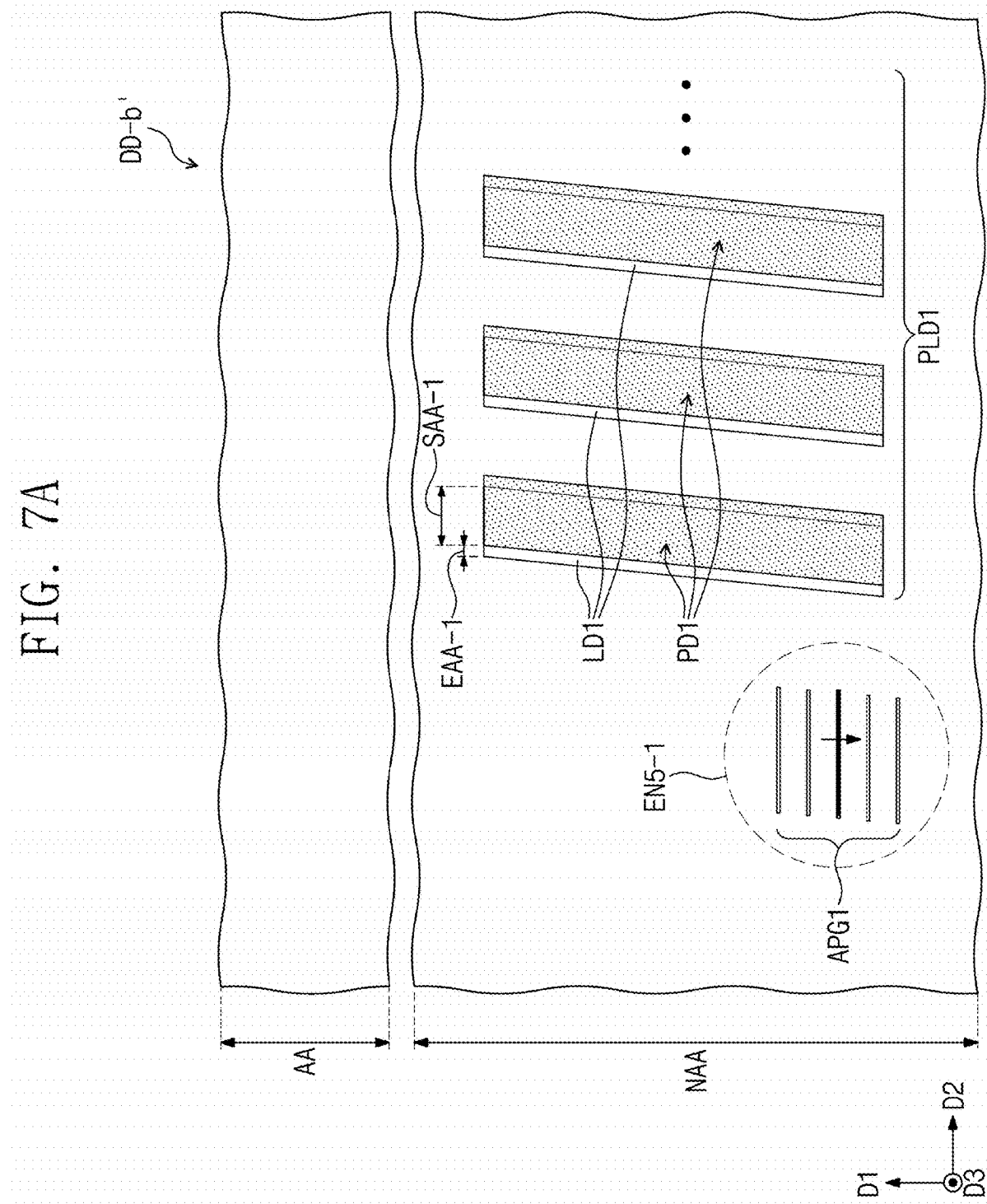

DISPLAY DEVICE

This application claims priority to Korean Patent Application No. 10-2020-0086859, filed on Jul. 14, 2020, and all the benefits accruing therefrom under 35 U.S.C. § 119, the content of which in its entirety is herein incorporated by reference.

BACKGROUND

1. Field

The disclosure relates to a display device. More particularly, the disclosure relates to a display device including alignment pads.

2. Description of the Related Art

A display device may include two or more electronic components. A display device, such as a mobile phone, a notebook computer, a television set, and the like, may include electronic components, such as a display panel for displaying an image, a circuit board, and the like.

SUMMARY

In a display device, electronic components are electrically connected to each other through connections between pads. However, when two electronic components are connected to each other using pads, a process error, e.g., misalignment, may occur, and thus, reliability in connection between the electronic components may be lowered.

Embodiments of the disclosure provide a display device in which a positional relationship of misaligned pads may be quickly checked using alignment pads included in a flexible film.

An embodiment of the invention provides a display device including a display panel in which a display area and a non-display area are defined, and a flexible film. In such an embodiment, the display panel includes a plurality of first signal pads disposed in the non-display area, inclined with respect to an imaginary center axis extending in a first direction, and disposed at one side of the imaginary center axis, a plurality of second signal pads disposed in the non-display area, inclined with respect to the imaginary center axis, and disposed at the other side of the imaginary center axis, a first fixing pad, and a second fixing pad spaced apart from the first fixing pad with the first and second signal pads interposed therebetween in a second direction substantially perpendicular to the first direction. In such an embodiment, the flexible film includes a plurality of first connection pads overlapping the first signal pads, a plurality of second connection pads overlapping the second signal pads, a first alignment pad group, and a second alignment pad group spaced apart from the first alignment pad group with the first and second connection pads interposed therebetween in the second direction. In such an embodiment, the first alignment pad group includes n first alignment pads arranged in the first direction, the second alignment pad group includes n second alignment pads corresponding to the first alignment pads, and a distance between corresponding first and second alignment pads decreases as a distance thereof from the display area decreases. In such an embodiment, the first fixing pad overlaps one of the first alignment pads, the second fixing pad overlaps one of the second alignment pads, where n is an integer equal to or greater than 3.

In an embodiment, the first connection pads may entirely overlap the first signal pads, and the second connection pads may entirely overlap the second signal pads.

In an embodiment, an inclination of an imaginary line which connects ends of the first alignment pads adjacent to the imaginary center axis may correspond to an inclined angle of the first connection pads, and an inclination of an imaginary line which connects ends of the second alignment pads adjacent to the imaginary center axis may correspond to an inclined angle of the second connection pads.

In an embodiment, the first alignment pads may be symmetrical with the second alignment pads with respect to the imaginary center axis.

In an embodiment, the distance between the corresponding first and second alignment pads may sequentially decrease with a tolerance equal to or greater than about 3 micrometers and equal to or less than about 4 micrometers as the distance thereof from the display area decreases.

In an embodiment, the first fixing pad and the second fixing pad may overlap a k-th first alignment pad and a k-th second alignment pad, respectively, the first signal pads may entirely overlap the first connection pads, respectively, and the second signal pads entirely may overlap the second connection pads, respectively, where k is an integer equal to or greater than 2 and equal to or less than the n.

In an embodiment, a distance in the second direction between the k-th first alignment pad and the k-th second alignment pad may correspond to a distance in the second direction between the first fixing pad and the second fixing pad.

In an embodiment, the first fixing pad and the second fixing pad may overlap a (k+a)-th first alignment pad and a (k+a)-th second alignment pad, respectively, the first signal pads include a first portion which overlaps the first connection pads and a second portion which does not overlap the first connection pads, the second signal pads include a first portion which overlaps the second connection pads and a second portion which does not overlap the second connection pads, and the second portion of the first and second signal pads is closer to the display area than the first portion of the first and second signal pads is, where k is an integer equal to or greater than 2 and equal to or less than n, and a is an integer equal to or greater than 1 and equal to or less than n−k.

In an embodiment, a distance in the second direction between a k-th first alignment pad and a k-th second alignment pad may be less than a distance in the second direction between the first fixing pad and the second fixing pad.

In an embodiment, the first fixing pad and the second fixing pad may overlap a (k−a)-th first alignment pad and a (k−a)-th second alignment pad, respectively, the first signal pads include a first portion which overlaps the first connection pads and a second portion which does not overlap the first connection pads, the second signal pads include a first portion which overlaps the second connection pads and a second portion which does not overlap the second connection pads, and the first portion of the first and second signal pads is closer to the display area than the second portion of the first and second signal pads is, where k is an integer equal to or greater than 2 and equal to or less than n, and a is an integer equal to or greater than 1 and equal to or less than k−1.

In an embodiment, a distance in the second direction between a k-th first alignment pad and a k-th second alignment pad may be greater than a distance in the second direction between the first fixing pad and the second fixing pad.

In an embodiment, the display device may further include a conductive adhesive layer disposed between the display panel and the flexible film.

In an embodiment, each of the first alignment pads and the second alignment pads may have a rectangular shape having a first side with a first length in the first direction and a second side with a second length in the second direction, the first fixing pad may have a rectangular shape corresponding to each of the first alignment pads, and the second fixing pad may have a rectangular shape corresponding to each of the second alignment pads.

In an embodiment, the first alignment pads adjacent to each other may be spaced apart from each other in the first direction by the first length, and the second alignment pads adjacent to each other may be spaced apart from each other in the first direction by the first length.

In an embodiment, the first signal pads and the first connection pads may be inclined at an angle equal to or greater than about 5 degrees and equal to or less than about 10 degrees with respect to the imaginary center axis, and the second signal pads and the second connection pads may be inclined at an angle equal to or greater than about 5 degrees and equal to or less than about 10 degrees with respect to the imaginary center axis. An embodiment of the invention provides a display device including a display panel in which a display area and a non-display area are defined, and a flexible film. In such an embodiment, the display panel includes a plurality of first signal pads disposed in the non-display area, inclined at an inclination angle (θ) with respect to an imaginary center axis extending in a first direction, and disposed at one side of the imaginary center axis, a plurality of second signal pads disposed in the non-display area, inclined at the inclination angle (θ) with respect to the imaginary center axis, and disposed at the other side of the imaginary center axis, a first fixing pad, and a second fixing pad spaced apart from the first fixing pad with the first and second signal pads interposed therebetween. In such an embodiment, the flexible film includes a plurality of first connection pads inclined at the inclination angle (θ) with respect to the imaginary center axis and disposed at one side of the imaginary center axis, a plurality of second connection pads inclined at the inclination angle (θ) with respect to the imaginary center axis and disposed at the other side of the imaginary center axis, a first alignment pad group, and a second alignment pad group spaced apart from the first alignment pad group with the first and second connection pads interposed therebetween. In such an embodiment, the first alignment pad group includes n first alignment pads which are sequentially arranged toward the display area and spaced apart from each other at a first distance and have a first length in the first direction, the second alignment pad group includes n second alignment pads corresponding to the first alignment pads and having the first length in the first direction, a second distance between an m-th first alignment pad and an m-th second alignment pad and a third distance between an (m−1)-th first alignment pad and an (m−1)-th second alignment pad satisfy the following equation: $\tan\theta=((d-c)/2)/(a+b)$, where a denotes the first distance, b denotes the first length, c denotes the second distance between the m-th first alignment pad and the m-th second alignment pad, and d denotes the third distance between the (m−1)-th first alignment pad and the (m−1)-th second alignment pad, n is an integer equal to or greater than 3, and m is an integer equal to or greater than 1 and equal to or less than n.

In an embodiment, the second distance may be less than the third distance.

In an embodiment, the first fixing pad may overlap a k-th first alignment pad, and the second fixing pad may overlap a k-th second alignment pad corresponding to the k-th first alignment pad.

According to embodiments of the invention, as set forth herein, the flexible film includes the alignment pads by which the positional relationship between misaligned pads is able to be checked, and thus, a process of aligning the signal pads of the display panel and the connection pads of the flexible film may be automated.

BRIEF DESCRIPTION OF THE DRAWINGS

The above and other features of the disclosure will become readily apparent by reference to the following detailed description when considered in conjunction with the accompanying drawings, in which:

FIG. 4 is a plan view showing fixing pads of a display device according to an embodiment of the disclosure;

FIG. 5A is an enlarged plan view showing a portion of the display device shown in FIG. 2A;

FIG. 5B is an enlarged view showing a portion EN3 in which first alignment pads overlap a first fixing pad of FIG. 5A;

FIG. 6A is an enlarged view showing a portion of a display device before alignment;

FIG. 6D is an enlarged view showing a portion EN4-2 in which the first alignment pads overlap the first fixing pad of the display device of FIG. 6C;

FIG. 7A is an enlarged view showing a display device before alignment;

DETAILED DESCRIPTION

Figure 1A:
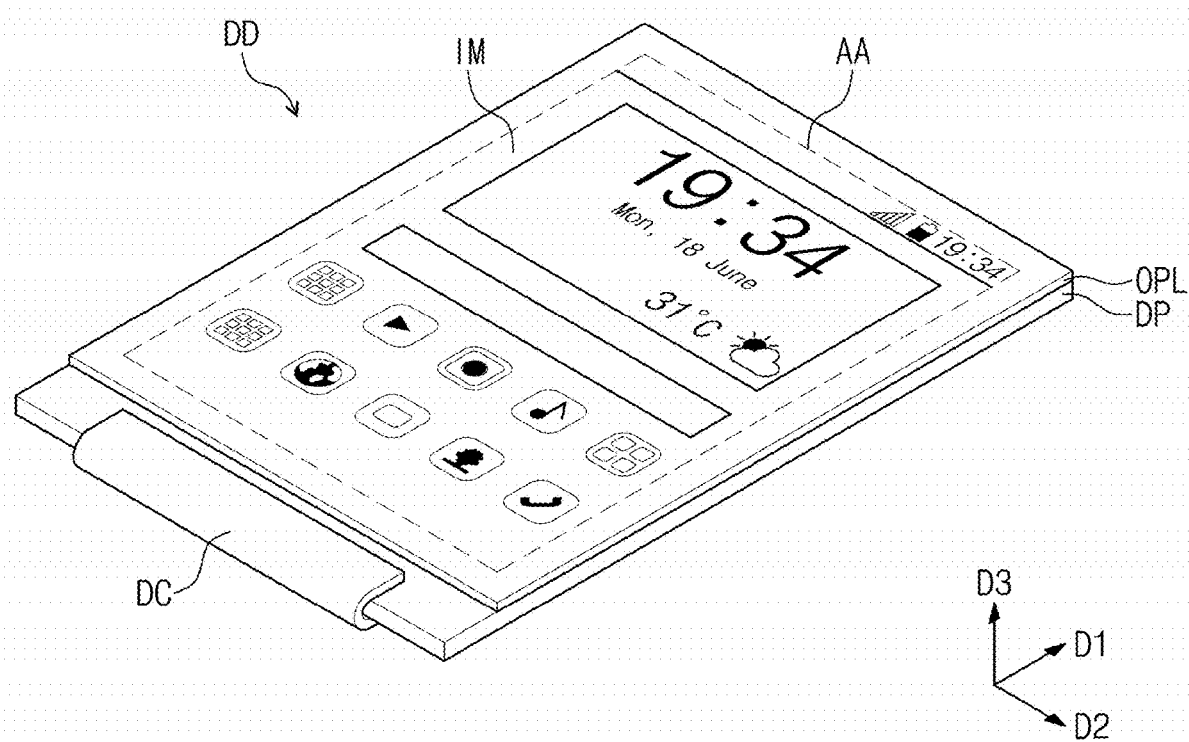
FIG. 1A is a perspective view showing a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the disclosure, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "connected directly to" or "coupled directly to" another element, there are no intervening elements present.

Like numerals refer to like elements throughout. In the drawings, the thickness, ratio, and dimension of components are exaggerated for effective description of the technical content.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element S) or feature S) as shown in the figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 1B:
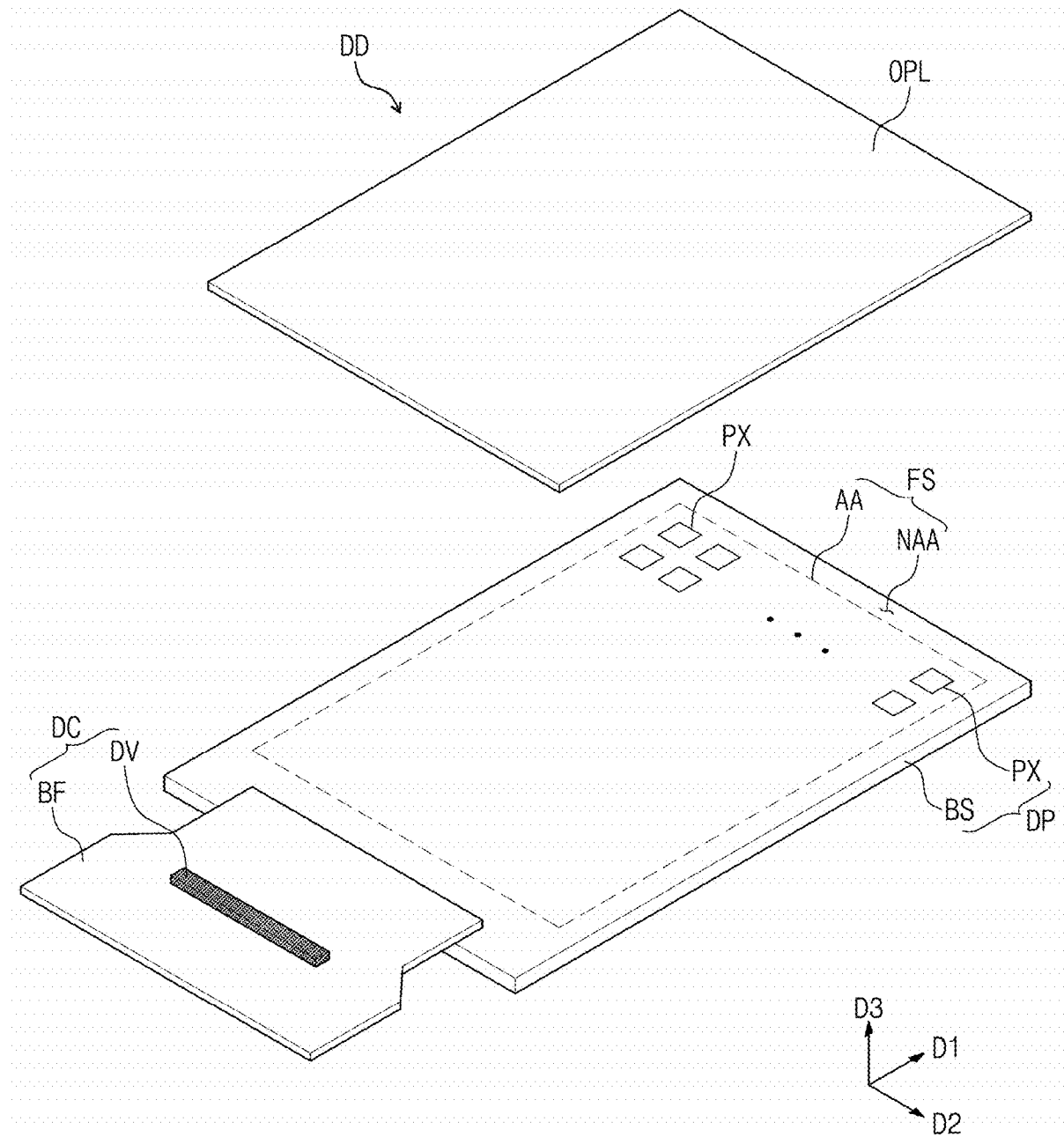
FIG. 1B is an exploded perspective view showing a display device according to an embodiment of the disclosure.
Figure 1C:
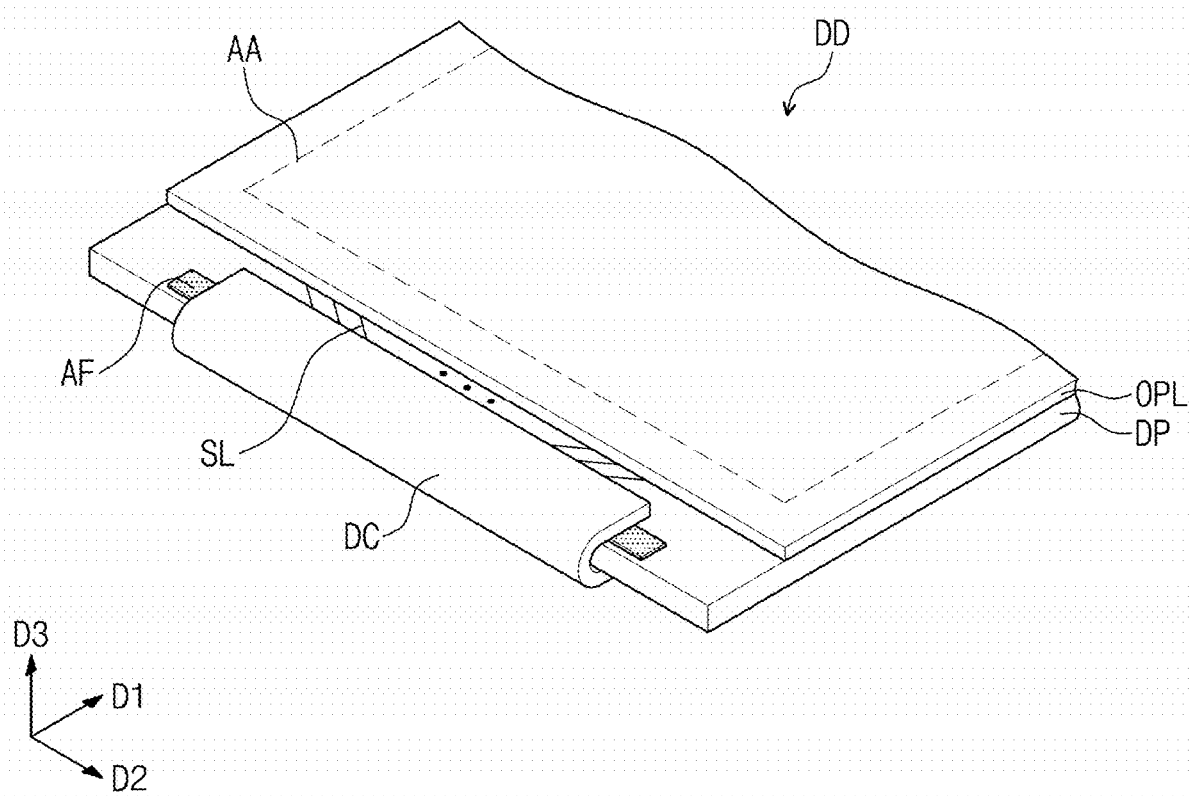
FIG. 1C is a perspective view showing a portion of a display device according to an embodiment of the disclosure.

FIG. 1A is a perspective view showing a display device DD according to an embodiment of the disclosure. FIG. 1B is an exploded perspective view showing the display device DD according to an embodiment of the disclosure. FIG. 1C is a perspective view showing a portion of the display device DD according to an embodiment of the disclosure. Hereinafter, embodiments of the display device DD will be described in detail with reference to FIGS. 1A to 1C.

Referring to FIGS. 1A to 1C, an embodiment of the display device DD may include a display panel DP, a circuit substrate DC, a conductive adhesive member AF, and an optical member OPL. The display panel DP may display an image IM through a front surface FS. The front surface FS may be substantially parallel to a first direction D1 and a second direction D2 and perpendicular to a third direction D3. The front surface FS may include an active area AA through which the image IM is displayed and a peripheral area NAA adjacent to the active area AA. FIG. 1B shows an embodiment where a frame-shaped peripheral area NAA surrounds the active area AA, however, this is merely exemplary, and the disclosure is not limited thereto or thereby. In one alternative embodiment, for example, the peripheral area NAA may be defined adjacent to a portion of an edge of the active area AA.

The display panel DP may include a plurality of pixels PX arranged in the active area AA of a base substrate BS. In an embodiment, each of the pixels PX may receive electrical signals and may display lights to form the image. In an embodiment, as shown in FIG. 1B, the pixels PX are arranged spaced apart from each other to correspond to light emitting areas, however, this is merely exemplary, and the disclosure is not limited thereto or thereby. Alternatively, some components of the pixels PX may be disposed to overlap each other when viewed in a plane.

The circuit substrate DC may be disposed at one side of the display panel DP and may be electrically connected to the display panel DP. The circuit substrate DC may generate electrical signals to apply the electrical signals to the display panel DP or may receive and process electrical signals generated by the display panel DP.

The electrical signals generated by the circuit substrate DC may be respectively applied to the pixels PX through signal lines SL of the display panel DP. The circuit substrate DC may include a flexible film BF and a driving circuit DV. The flexible film BF may be attached to the display panel DP using a conductive adhesive member AF. The flexible film BF may have flexibility. Accordingly, the flexible film BF may be bent toward a rear surface of the display panel DP while being assembled to the display panel DP.

The driving circuit DV may be disposed or mounted on the flexible film BF. The driving circuit DV may be electrically connected to the flexible film BF through circuit lines (not shown) included in the flexible film BF. The flexible film BF may electrically connect the driving circuit DV to the display panel DP, and the driving circuit DV may generate the electrical signals to be applied to the display panel DP or may process the electrical signals provided from the display panel DP.

In an embodiment, as shown in FIG. 1C, the conductive adhesive member AF may be disposed between the flexible film BF and the display panel DP to couple the flexible film BF to the display panel DP. The conductive adhesive member AF may have both conductivity and adhesion. Accordingly, the conductive adhesive member AF may physically and electrically couple the circuit substrate DC to the display panel DP. The conductive adhesive member may include an anisotropic conductive adhesive film ("ACF"), for example.

The conductive adhesive member AF may extend in a direction crossing the signal lines SL. In an embodiment, the conductive adhesive member AF may have a shape extending in the second direction D2. In an embodiment, a portion of the conductive adhesive member AF may protrude outward from the flexible film BF. In such an embodiment, a length in the first direction D1 of the conductive adhesive member AF on the display panel DP may be equal to or greater than a length in the first direction D1 of the flexible film BF. Accordingly, an end of the conductive adhesive member AF may be aligned with a corner of the flexible film BF, or a portion of the conductive adhesive member AF may be exposed without being covered by the flexible film BF.

The optical member OPL may be disposed on the display panel DP. The optical member OPL may cover the active area AA. The optical member OPL may be optically transparent. Accordingly, the image IM displayed through the active area AA may transmit through the optical member OPL. The image IM displayed by the display panel DP may be displayed on the optical member OPL after transmitting therethrough, and thus, may be easily perceived by a user.

The optical member OPL may further cover at least a portion of the peripheral area NAA. The optical member OPL may reduce a reflectance of an external light. The optical member OPL may reduce an incident rate of the external light incident into the front surface FS of the display panel DP, or when the external light incident through the optical member OPL is reflected by components of the display panel DP, the optical member OPL may reduce a transmittance of the reflected light. In one embodiment, for example, the optical member OPL may include at least one selected from a polarization flexible film and a retardation flexible film. However, this is merely exemplary, and alternatively, the optical member OPL may include a color filter. In an embodiment, the optical member OPL may be attached to the front surface FS of the display panel DP by an adhesive member (not shown) or may be formed directly on the front surface FS of the display panel DP.

The connection between the signal lines SL and the circuit substrate DC may be achieved by an alignment between the conductive adhesive member AF and pads and an alignment between the circuit substrate DC and the conductive adhesive member AF.

Figure 2A:
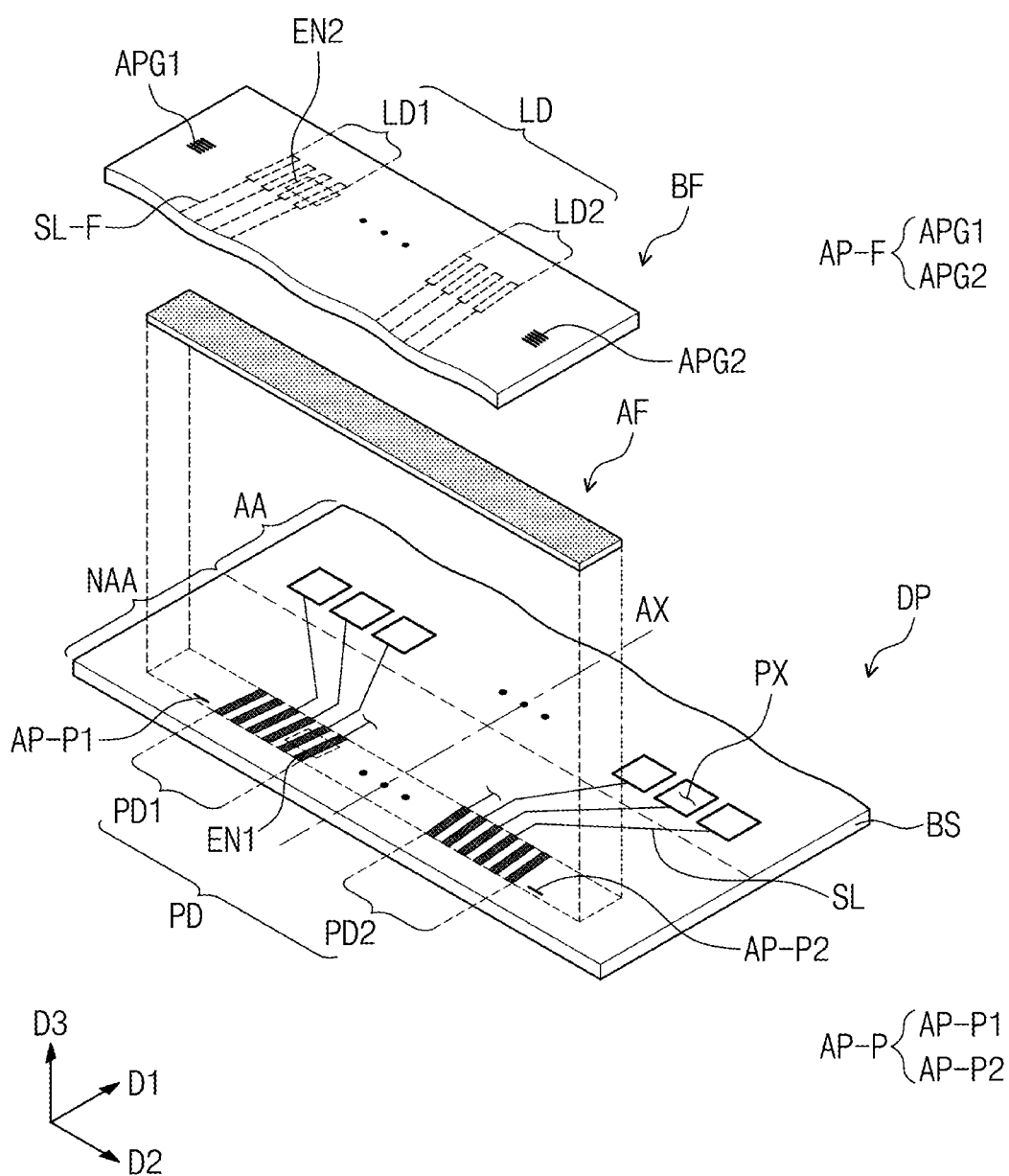
FIG. 2A is an exploded perspective view showing a portion of the display device shown in FIG. 1A.
Figure 2B:
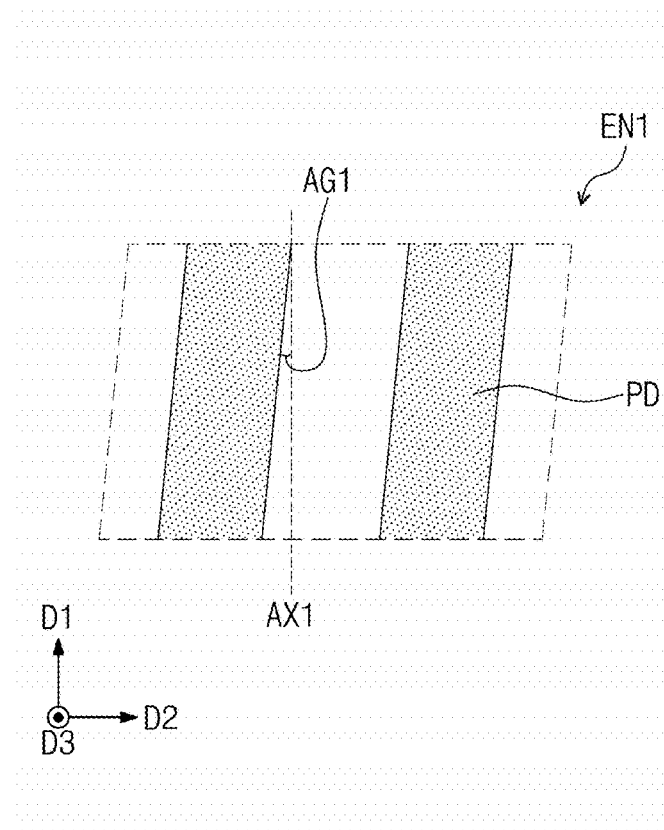
FIG. 2B is an enlarged view showing a portion EN1 of signal pads shown in FIG. 2A.
Figure 2C:
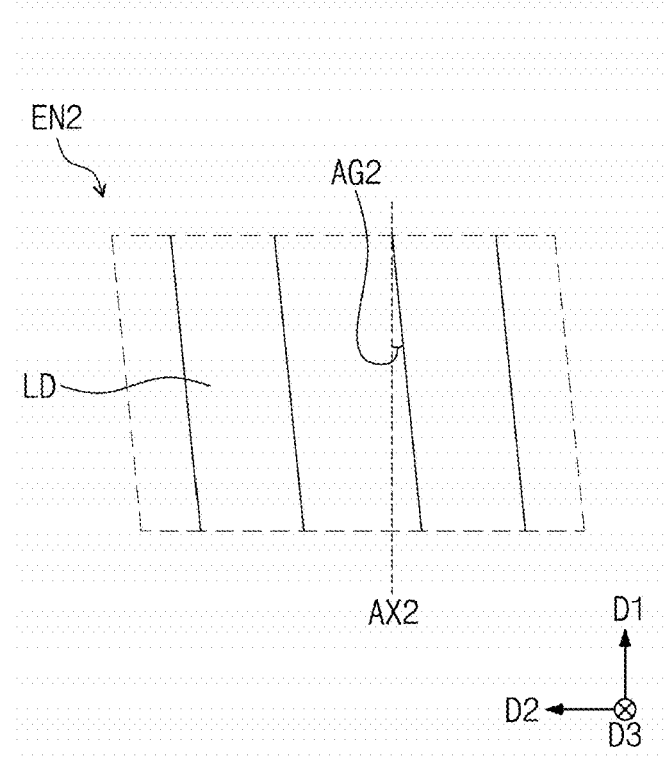
FIG. 2C is an enlarged view showing a portion EN2 of connection pads shown in FIG. 2A.
Figure 2D:
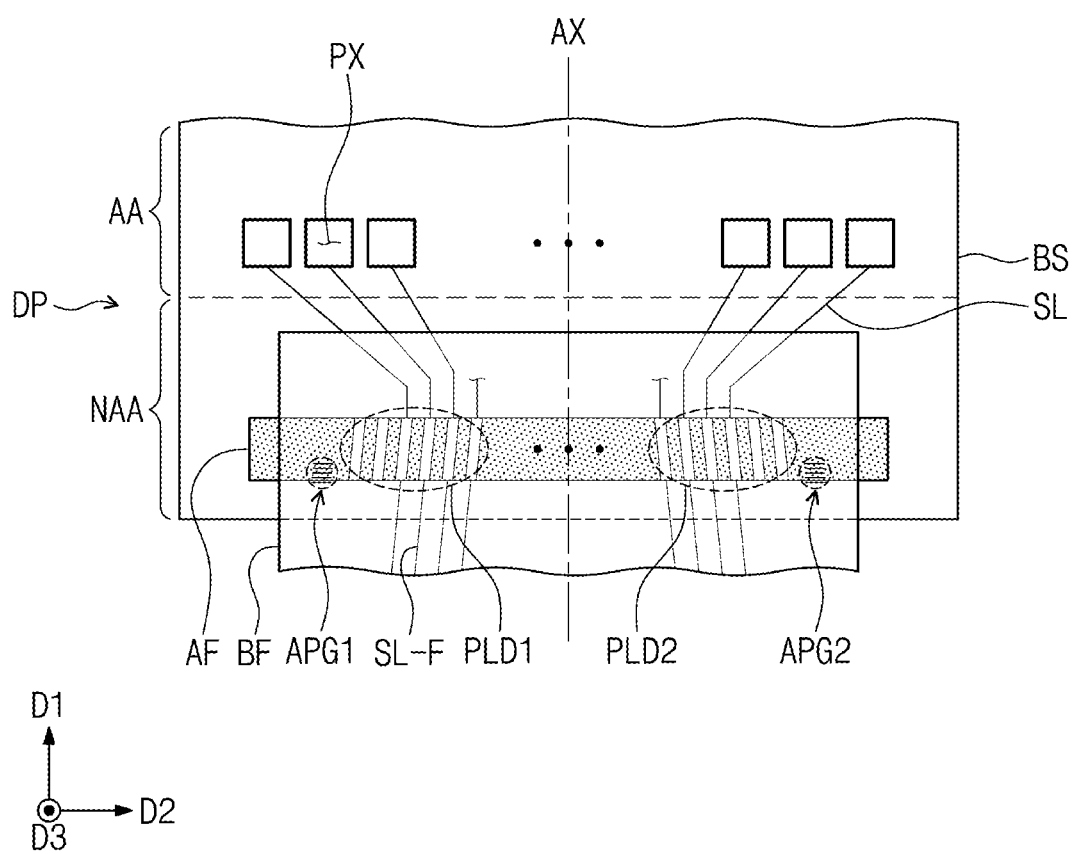
FIG. 2D is a plan view showing a portion of a display device shown in FIG. 2A.

FIG. 2A is an exploded perspective view showing a portion of the display device shown in FIG. 1A. FIG. 2B is an enlarged view showing a portion EN1 of signal pads shown in FIG. 2A. FIG. 2C is an enlarged view showing a portion EN2 of connection pads shown in FIG. 2A. FIG. 2D is a plan view showing a portion of the display device shown in FIG. 2A. Hereinafter, an embodiment of the display device DD will be described in detail with reference to FIGS. 2A to 2D.

Referring to FIGS. 2A to 2D, an embodiment of the display panel DP may include the base substrate BS, the pixels PX, the signal lines SL, first signal pads PD1, second signal pads PD2, a first fixing pad AP-P1, and a second fixing pad AP-P2. For convenience of illustration and description, only some of the pixels PX, the signal lines SL, the first signal pads PD1, and the second signal pads PD2 are shown in FIG. 2A. The base substrate BS may include a display area AA and a non-display area NAA.

The pixels PX may be arranged in the display area AA, and the signal lines SL respectively connected to the pixels PX and extending in the non-display area NAA from the display area AA may be respectively connected to the first signal pads PD1 and the second signal pads PD2. Here, the first signal pads PD1 and the second signal pads PD2 may be collectively referred to as signal pads PD. The electrical signals provided from the first signal pads PD1 and the second signal pads PD2 may be applied to each pixel PX through the signal lines SL.

The display panel DP may include the first signal pads PD1 disposed at one side with respect to a center axis AX and the second signal pads PD2 disposed at the other side with respect to the center axis AX. The first signal pads PD1 and the second signal pads PD2 may be disposed to be inclined with respect to the center axis AX at a first angle AG1. According to an embodiment, the first angle AG1 may be equal to or greater than about 5° and equal to or less than about 10°. Here, the center axis AX may be defined as an imaginary line extending in the first direction D1 at a center of the display panel DP when viewed in a plane.

The display panel DP may include the first fixing pad AP-P1 and the second fixing pad AP-P2, which are spaced apart from each other in the second direction D2, with the first signal pads PD1 and the second signal pads PD2 interposed therebetween. The first fixing pad AP-P1 and the second fixing pad AP-P2 may be symmetrical with each other with respect to the center axis AX. Here, the first fixing pad AP-P1, and the second fixing pad AP-P2 may be collectively referred to as fixing pads AP-P.

The flexible film BF may include first connection pads LD1, second connection pads LD2, lines SL-F connected to each of the first connection pads LD1 and the second connection pads LD2, a first alignment pad group APG1, and a second alignment pad group APG2 spaced apart from the first alignment pad group APG1 with the first connection pads LD1 and the second connection pads LD2 interposed therebetween. Here, the first connection pads LD1 and the second connection pads LD2 may be collectively referred to as connection pads LD. The first connection pads LD1 may be disposed at one side with respect to the center axis AX, and the second connection pads LD2 may be disposed at the other side with respect to the center axis AX.

The flexible film BF may include the first alignment pad group APG1 and the second alignment pad group APG2 spaced apart from the first alignment pad group APG1 in the second direction D2 with the first connection pads LD1 and the second connection pads LD2 interposed therebetween. Here, the first alignment pad group APG1 and the second alignment pad group APG2 may be collectively referred to as alignment pad groups AP-F.

Each of the first signal pads PD1 and the second signal pads PD2 may be disposed to be inclined at the first angle AG1 with respect to an imaginary line AX1 substantially parallel to the center axis AX. According to an embodiment, each of the first connection pads LD1 and the second connection pads LD2 may be disposed to be inclined at a second angle AG2, which is the same as the first angle AG1, with respect to an imaginary line AX2 substantially parallel to the center axis AX and to entirely overlap corresponding first or second signal pads of the first signal pads PD1 and the second signal pads PD2.

In an embodiment, the display device DD may include first overlap pads PLD1 defined by overlapping portions of the first signal pads PD1 and the first connection pads LD1 that are respectively and entirely overlap the first signal pads PD1, and second overlap pads PLD2 defined by overlapping portions of the second signal pads PD2 and the second connection pads LD2 that are respectively and entirely overlap the second signal pads PD2.

An m-th first alignment pad SAP1-$m$ (refer to FIG. 4A) included in the first alignment pad group APG1 may overlap the first fixing pad AP-P1, and an m-th second alignment pad SAP2-$m$ (refer to FIG. 4A) included in the second alignment pad group APG2 may overlap the second fixing pad AP-P2. A relationship between the fixing pads AP-P1 and AP-P2 and the m-th alignment pads SAP1-$m$ and SAP2-$m$ (refer to FIG. 4A) included in the alignment pad groups APG1 and APG2 will be described later in greater detail with reference to FIGS. 5A and 5B.

Figure 3A:
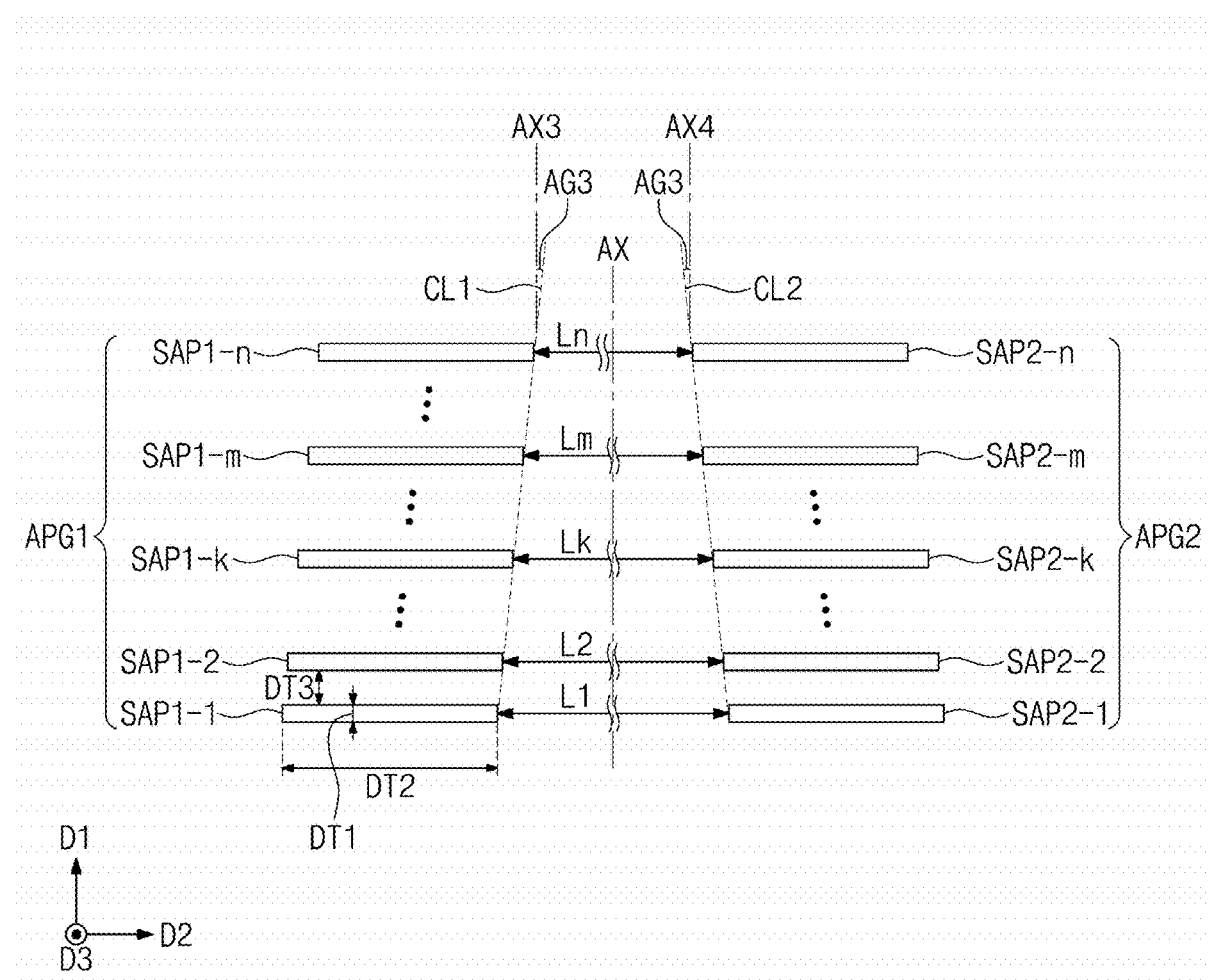
FIG. 3A is a plan view showing alignment pads of a display device according to an embodiment of the disclosure.
Figure 3B:
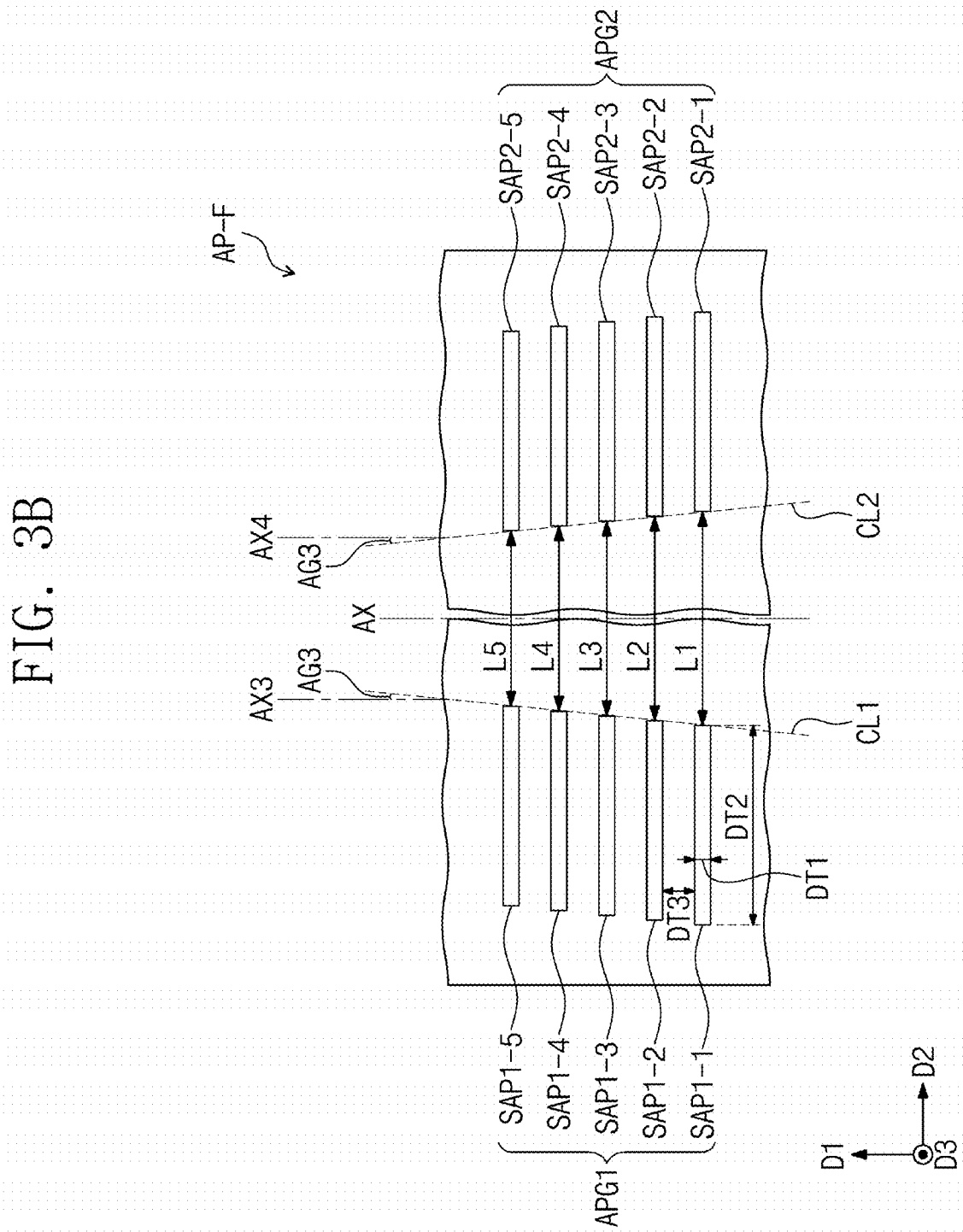
FIG. 3B is a plan view showing alignment pads of a display device according to an embodiment of the disclosure.

FIGS. 3A and 3B are plan views showing the first and second alignment pad groups included in the display device DD according to an embodiment of the disclosure.

Referring to FIG. 3A, in an embodiment, the flexible film BF may include the first alignment pad group APG1 and the second alignment pad group APG2 spaced apart from first alignment pad group APG1 in the second direction D2 with the connection pads LD1 and LD2 (refer to FIG. 2A) interposed therebetween. For convenience of illustration and description, the connection pads LD1 and LD2 (refer to FIG. 2A) disposed between the first alignment pad group APG1 and the second alignment pad group APG2 are omitted in FIG. 3A.

The first alignment pad group APG1 may include n first alignment pads SAP1-1, SAP1-2, . . . , SAP1-$k$, . . . , SAP1-$m$, . . . , and SAP1-$n$, and the second alignment pad group APG2 may include n second alignment pads SAP2-1, SAP2-2, . . . , SAP2-$k$, . . . , SAP2-$m$, . . . , and SAP2-$n$. The first alignment pad group APG1 and the second alignment pad group APG2 may be symmetrical with each other with respect to the center axis AX. Here, n is an integer equal to or greater than 3, and k is an integer equal to or greater than 2 and equal to or less than n.

The first alignment pads SAP1-1, SAP1-2, . . . , SAP1-$k$, . . . , SAP1-$m$, . . . , and SAP1-$n$ neighbored to each other and the second alignment pads SAP2-1, SAP2-2, . . . , SAP2-$k$, . . . , SAP2-$m$, . . . , and SAP2-$n$ neighbored to each other may be arranged in the first direction D1 to be spaced apart from each other with a tolerance or a predetermined distance.

The alignment pads may be sequentially arranged toward the display area AA (refer to FIG. 2$a$) in order of the first alignment pads SAP1-1 and SAP2-1 corresponding to each other, the second alignment pads SAP1-2 and SAP2-2 corresponding to each other, and the third alignment pads SPA1-3 and SPA2-3 corresponding to each other. That is, the m-th alignment pads SAP1-$m$ and SAP2-$m$ may be closer to the display area AA (refer to FIG. 2$a$) than (m−1)-th alignment pads (not shown) are. In the disclosure, m is an integer equal to or greater than about 1 and equal to or less than n, and m may be the same as or different from k.

The m-th first alignment pad SAP1-$m$ and the m-th second alignment pad SAP2-$m$ may correspond to each other in each of the first alignment pads SAP1-1, SAP1-2, . . . , SAP1-$k$, . . . , SAP1-$m$, . . . , and SAP1-$n$ and the second alignment pads SAP2-1, SAP2-2, . . . , SAP2-$k$, SAP2-$m$, . . . , and SAP2-$n$. The m-th first alignment pad SAP1-$m$ and the m-th second alignment pad SAP2-$m$ corresponding to the m-th first alignment pad SAP1-$m$ may be spaced apart from each other in the second direction D2 by a distance Lm. Distances L1, L2, . . . , Lk, . . . Lm, . . . , and Ln between the first alignment pads SAP1-1, SAP1-2, . . . , SAP1-$k$, SAP1-$m$, . . . , and SAP1-$n$ and the second alignment pads SAP2-1, SAP2-2, . . . , SAP2-$k$, SAP2-$m$, . . . , and SAP2-$n$ may sequentially decrease with a tolerance toward the display area AA (refer to FIG. 2A) along the first direction DR1. According to an embodiment, the distances L1, L2, . . . , Lk, . . . Lm, . . . , and Ln between the first alignment pads SAP1-1, SAP1-2, . . . , SAP1-$k$, . . . , SAP1-$m$, . . . , and SAP1-$n$ and the second alignment pads SAP2-1, SAP2-2, . . . , SAP2-$k$, . . . , SAP2-$m$, . . . , and SAP2-$n$ in the second direction D2 may sequentially decrease with the tolerance or a distance equal to or greater than about 3 micrometers and equal to or less than about 4 micrometers toward the display area AA (refer to FIG. 2A) along the first direction D1. In one embodiment, for example, the distance L2 between the second first alignment pad SAP1-2 and the second second alignment pad SAP2-2 may decrease by about 3 micrometers or greater and about 4 micrometers or less with respect to the distance L1 between the first first alignment pad SAP1-1 and the first second alignment pad SAP2-1, and the distance Lm in the second direction D2 between the m-th first alignment pad SAP1-$m$ and the m-th second alignment pad SAP2-$m$ may decrease by about 3 micrometers or greater and about 4 micrometers or less with respect to a distance (not shown) in the second direction D2 between an (m−1)-th first alignment pad (not shown) and an (m−1)-th second alignment pad (not shown).

Each of the first alignment pads SAP1-1, SAP1-2, . . . , SAP1-$k$, . . . , SAP1-$m$, . . . , and SAP1-$n$ and each of the second alignment pads SAP2-1, SAP2-2, SAP2-$k$, SAP2-$m$, . . . , and SAP2-$n$ may have a rectangular shape with a first side having a first length DT1 in the first direction D1 and a second side having a second length DT2 in the second direction D2.

A third length DT3 between the first alignment pads SAP1-1, SAP1-2, . . . , SAP1-$k$, . . . , SAP1-$m$, . . . , and SAP1-$n$ spaced apart from each other in the first direction D1 and a third length DT3 between the second alignment pads SAP2-1, SAP2-2, . . . , SAP2-$k$, . . . , SAP2-$m$, . . . , and SAP2-$n$ spaced apart from each other in the first direction D1 may be substantially the same as the first length DT1.

A line CL1 that connects ends of the first alignment pads SAP1-1, SAP1-2, . . . , SAP1-$k$, . . . , SAP1-$m$, . . . , and SAP1-$n$ and a line CL2 that connects ends of the second alignment pads SAP2-1, SAP2-2, . . . , SAP2-$k$, . . . , SAP2-$m$, . . . , and SAP2-$n$ may be inclined at a third angle AG3 with respect to imaginary lines AX3 and AX4 substantially parallel to the center axis AX. An inclination of the line CL1 corresponds to an inclined angle of the first connection pads. An inclination of the line CL2 corresponds to an inclined angle of the second connection pads. The third angle AG3 may be substantially the same as the first angle AG1 (refer to FIG. 2B) defined by the first signal pads PD1 and the first connection pads LD1 disposed to be inclined with respect to the imaginary lines AX1(refer to FIG. 2B) substantially parallel to the center axis AX. The third angle AG3 may be an angle corresponding to the second angle AG2 (refer to FIG. 2C) defined by the second signal pads PD2 and the second connection pads LD2 disposed to be inclined with respect to the center axis AX2 (refer to FIG. 2C) substantially parallel to the center axis AX.

The first angle AG1 (refer to FIG. 2B), the third length DT3 in the first direction D1 between the first alignment pads SAP1-1, SAP1-2, ..., SAP1-*k*, ..., SAP1-*m*, ..., and SAP1-*n* and the second alignment pads SAP2-1, SAP2-2, ..., SAP2-*k*, ..., SAP2-*m*, ..., and SAP2-*n*, which are neighbored to each other, the first length DT1 of the side in the first direction D1 of the first alignment pads and the second alignment pads, the distance Lm between the m-th first alignment pad SAP1-*m* and the m-th second alignment pad SAP2-*m* corresponding to the m-th first alignment pad SAP1-*m*, and the distance between the (m−1)-th first alignment pad (not shown) and the (m−1)-th second alignment pad (not shown) may satisfy the following Equation 1.

$$\tan\theta = ((d-c)/2)/(a+b) \quad \text{[Equation 1]}$$

In Equation 1, "θ" denotes the first angle AG1 (refer to FIG. 2B), "a" denotes the third length DT3 in the first direction between the first alignment pads SAP1-1, SAP1-2, ..., SAP1-*k*, ..., SAP1-*m*, ..., and SAP1-*n* and between the second alignment pads SAP2-1, SAP2-2, ..., SAP2-*k*, ..., SAP2-*m*, ..., and SAP2-*n*, which are neighbored to each other, "b" denotes the first length DT1 of the side of the first alignment pads and the second alignment pads in the first direction, "c" denotes the distance Lm between the m-th first alignment pad SAP1-*m* and the m-th second alignment pad SAP2-*m* corresponding to the m-th first alignment pad SAP1-*m*, and "d" denotes the distance (not shown) between the (m−1)-th first alignment pad (not shown) and the (m−1)-th second alignment pad (not shown) corresponding to the (m−1)-th first alignment pad (not shown). As the first alignment pads SAP1-1, SAP1-2, ..., SAP1-*k*, ..., SAP1-*m*, ..., and SAP1-*n* and the second alignment pads SAP2-1, SAP2-2, ..., SAP2-*k*, ..., SAP2-*m*, ..., and SAP2-*n*, which satisfy Equation 1, are included, the display panel DP (refer to FIG. 2D) may overlap the flexible film BF (refer to FIG. 2D) such that the first signal pads PD1 respectively overlap the first connection pads LD1 and the second signal pads PD2 respectively overlap the second connection pads LD2 without separately measuring the distances between the first signal pads PD1, the second signal pads PD2, the first connection pads LD1, and the second connection pads LD2, which are arranged in the second direction D2.

The first alignment pads SAP1-1, SAP1-2, ..., SAP1-*k*, ..., SAP1-*m*, ..., and SAP1-*n* and the second alignment pads SAP2-1, SAP2-2, ..., SAP2-*k*, ..., SAP2-*m*, and SAP2-*n* may include a k-th first alignment pad SAP1-*k* and a k-th second alignment pad SAP2-*k*, which respectively serve as a reference pad. A distance Lk in the second direction D2 between the k-th first alignment pad SAP1-*k* and the k-th second alignment pad SAP2-*k* may be substantially the same as the distance Lk in the second direction D2 between the first fixing pad AP-P1 and the second fixing pad AP-P2.

The first alignment pads SAP1-1, SAP1-2, ..., SAP1-*k*, ..., SAP1-*m*, ..., and SAP1-*n* may include (k−a)-th (a is an integer equal to or greater than 1 and equal to or less than k−1) first alignment pads SAP1-1, ..., and SAP1-(k−1) and (k+a')-th first alignment pads SAP1-(k+1), ..., and SAP1-*n* (a' is an integer equal to or greater than 1 and equal to or less than n−k). The second alignment pads SAP2-1, SAP2-2, ..., SAP2-*k*, SAP1-*m*, ..., and SAP2-*n* may include (k−a)-th second alignment pads SAP2-1, ..., and SAP2-(k−1) corresponding to the (k−a)-th first alignment pads SAP1-1, ..., SAP1-(k−1) and (k+a')-th second alignment pads SAP2-(k+1), ..., and SAP2-*n* corresponding to the (k+a') th first alignment pads SAP1-(k+1), SAP1-*n*.

In FIG. 3A, the n first alignment pads SAP1-1, SAP1-2, ..., SAP1-*k*, ..., SAP1-*m*, ..., and SAP1-*n* and the n second alignment pads SAP2-1, SAP2-2, SAP2-*k*, ..., and SAP2-*n* are shown. Hereinafter, for convenience of illustration and description, as shown in FIG. 3B, five first alignment pads SAP1-1, SAP1-2, SAP1-3, SAP1-4, and SAP1-5 and five second alignment pads SAP2-1, SAP2-2, SAP2-3, SAP2-4, and SAP2-5 will be described as representative examples.

The k-th pads SPA1-*k* and SPA2-*k* that serve as reference pads in FIG. 3A may respectively correspond to a third first alignment pad SPA1-3 of the first alignment pad group APG1 and a third second alignment pad SPA2-3 of the second alignment pad group APG2 of FIG. 3B. The first to (k−1)-th first alignment pads SAP1-1, ..., and SAP1-(k−1) and the (k+1)-th to n-th first alignment pads SAP1-(k+1), ..., and SAP1-*n* of FIG. 3A may respectively correspond to (first and second first alignment pads SAP1-1 and SAP1-2 and fourth and fifth first alignment pads SAP1-4 and SAP1-5 of FIG. 3B, and the first to (k−1)-th second alignment pads SAP2-1, ..., and SAP2-(k−1) and the (k+1)-th to n-th second alignment pads SAP2-(k+1), ..., and SAP2-*n* of FIG. 3A may respectively correspond to first and second second alignment pads SAP2-1 and SAP2-2 and fourth and fifth second alignment pads SAP2-4 and SAP2-5 of FIG. 3B.

FIG. 4 is an enlarged view showing the fixing pads of the display device according to an embodiment of the disclosure. Referring to FIG. 4, the first fixing pad AP-P1 and the second fixing pad AP-P2 may be spaced apart from each other in the second direction D2. A distance Lp in the second direction D2 between the first fixing pad AP-P1 and the second fixing pad AP-P2 shown in FIG. 4 may be substantially the same as a distance L3 (refer to FIG. 3B) in the second direction D2 between the third first alignment pad SPA1-3 (refer to FIG. 3B) and the third second alignment pad SPA2-3 (refer to FIG. 3B). The first fixing pad AP-P1 and the second fixing pad AP-P2 may have a rectangular shape corresponding to that of the first alignment pads SAP1-1, SAP1-2, SAP1-3, SAP1-4, and SAP1-5 (refer to FIG. 3B) and the second alignment pads SAP2-1, SAP2-2, SAP2-3, SAP2-4, and SAP2-5 (refer to FIG. 3B).

FIG. 5A is an enlarged plan view showing a portion of the display device DD shown in FIG. 2A, and FIG. 5B is an enlarged view showing a portion EN3 in which the first alignment pads overlap the first fixing pad of FIG. 5A. For the convenience of illustration and description, only the first alignment pad group APG1, the first fixing pad AP-P1, some of the first signal pads PD1 among the signal pads PD1 and PD2, and the first connection pad LD1 among the connection pads LD1 and LD2 are shown and described.

Referring to FIGS. 5A and 5B, in the display device DD according to the embodiment, the third first alignment pad SAP1-3 of the first alignment pad group APG1 may entirely overlap the first fixing pad AP-P1, and the signal pad PD may entirely overlap the first connection pad LD1. The entire overlap between the signal pad PD and the first connection pad LD1 may mean that the signal pad PD entirely overlaps the first connection pad LD1 without being exposed.

The user may check whether the signal pad PD entirely overlaps the first connection pad LD1 based on an overlap relationship between the third first alignment pad SAP1-3 and the first fixing pad AP-P1. In an embodiment, when the first fixing pad AP-P1 overlaps the third first alignment pad SAP1-3 that serves as the reference, it may be checked whether the signal pad PD entirely overlaps the first connection pad LD1.

Figure 6B:
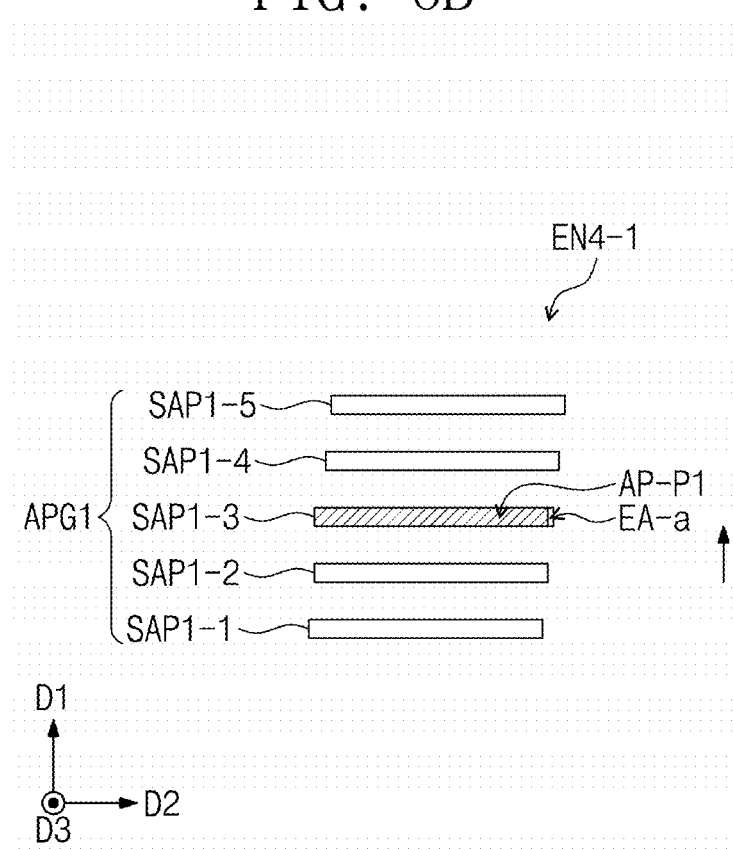
FIG. 6B is an enlarged view showing a portion EN4-1 in which first alignment pads overlap a first fixing pad of the display device of FIG. 6A.
Figure 6C:
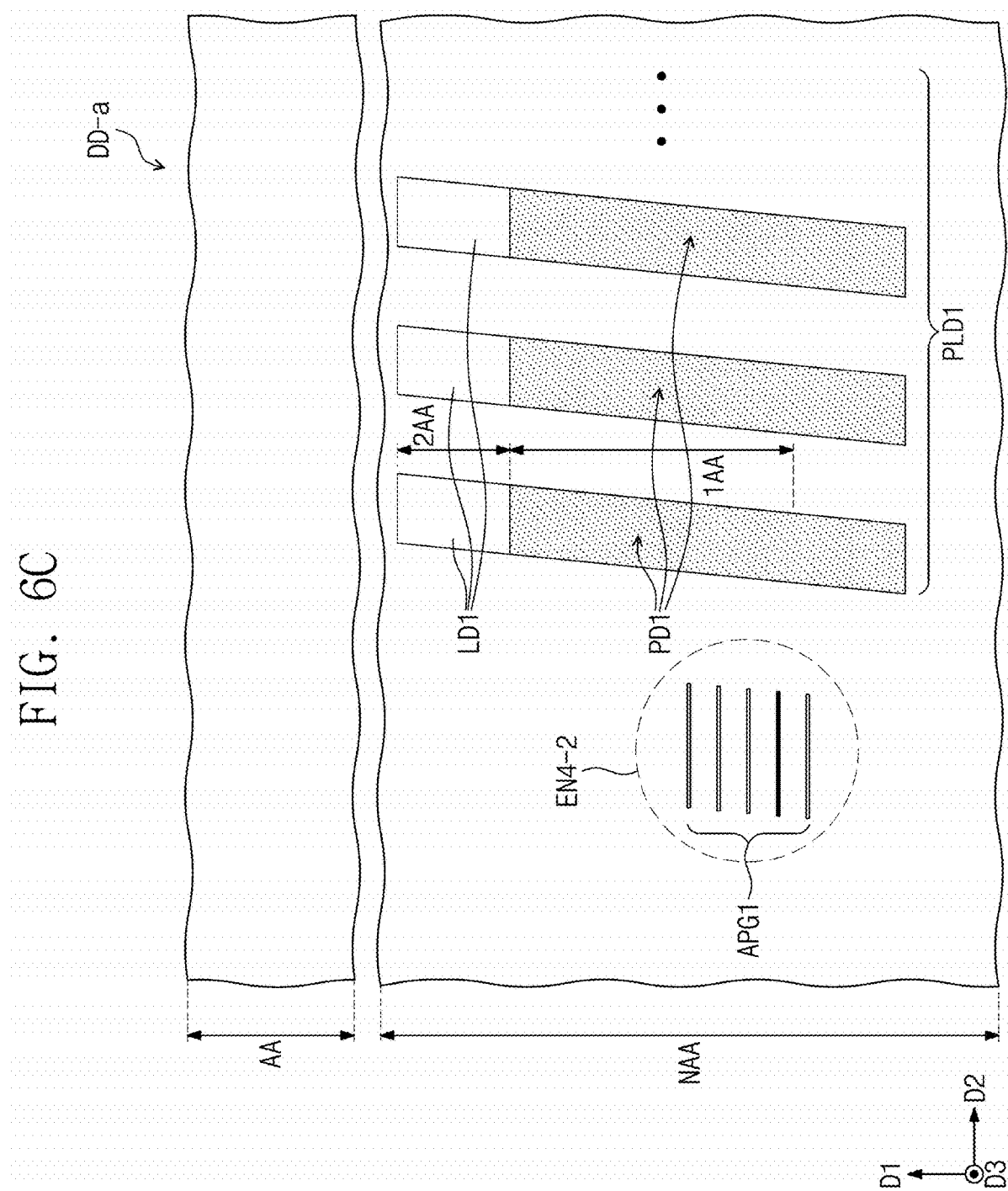
FIG. 6C is an enlarged view showing the display device after alignment.

FIG. 6A is an enlarged view showing a display device before alignment. FIG. 6B is an enlarged view showing a portion EN4-1 in which first alignment pads overlap a first fixing pad of the display device of FIG. 6A. FIG. 6C is an enlarged view showing the display device after alignment. FIG. 6D is an enlarged view showing a portion EN4-2 in which the first alignment pads overlap the first fixing pad of the display device of FIG. 6C. Hereinafter, the display device DD-a will be described in detail with reference to FIGS. 6A to 6D. Hereinafter, any repetitive detailed description of the same elements in FIGS. 6A to 6D as those of FIGS. 1A to 1C, 2A to 2D, 3A, 3B, 4, 5A, and 5B will be omitted, and different features from those of FIGS. 1A to 1C, 2A to 2D, 3A, 3B, 4, 5A, and 5B will be mainly described.

Referring to FIGS. 6A to 6D, an embodiment of the display device DD-a may include a first portion 1AA in which a first connection pad LD1 overlaps a signal pad PD and a second portion 2AA in which the first connection pad LD1 does not overlap the signal pad PD, and a first fixing pad AP-P1 may overlap a first first alignment pad SAP1-1 or a second first alignment pad SAP1-2 rather than a third first alignment pad SAP1-3 of a first alignment pad group APG1.

Referring to FIGS. 6A and 6B, when a flexible film BF (refer to FIG. 2A) is disposed on a display panel DP (refer to FIG. 2A) of the display device DD-a' before alignment, the first connection pad LD1 may include an overlap area SAA that overlaps the signal pad PD and a non-overlap area EAA that does not overlap the signal pad PD. The overlap area SAA may be closer to the first alignment pad group APG1 than the non-overlap area EAA is.

The third first alignment pad SAP1-3 that is the reference pad among the first alignment pad group APG1 may include a non-overlap portion EA-a that does not overlap the first fixing pad AP-P1. The non-overlap portion EA-a may be closer to the first connection pad LD1 than the overlap portion (not shown) is. A distance L3 (refer to FIG. 3B) between the third first alignment pad SAP1-3 that is the reference and the third second alignment pad SAP2-3 (refer to FIG. 3B) may be less than a distance Lp (refer to FIG. 4) between the first fixing pad AP-P1 and the second fixing pad AP-P2 (refer to FIG. 4).

Referring to FIGS. 6C and 6D, the flexible film BF may move toward a display area AA in the first direction D1 to correct a misalignment between the first connection pad LD1 and the signal pad PD in FIGS. 6A and 6B such that the first fixing pad AP-P1 entirely overlaps the second first alignment pad SAP1-2. After the flexible film BF is moved to allow the first fixing pad AP-P1 to overlap the second first alignment pad SAP1-2, the first connection pad LD1 may include a first portion 1AA that overlaps the signal pad PD and a second portion 2AA that does not overlap the signal pad PD. The second portion 2AA may be closer to the display area AA than the first portion 1AA is.

That is, when the non-overlap portion EA-a in which the third first alignment pad SAP1-3 does not overlap the first fixing pad AP-P1 is disposed to be closer to the first connection pad LD1 than the overlap portion (not shown) is, the flexible film BF may move toward the display area AA in the first direction D1 to allow the first fixing pad AP-P1 to entirely overlap one of the first and second first alignment pads SAP1-1 and SAP1-2. Accordingly, the signal pad PD and the first connection pad LD1 may be aligned to entirely overlap each other without separately measuring a length of all the first connection pads LD1 and the second connection pads LD2 (refer to FIG. 2A) that are arranged in the second direction D2 and a length of all the first signal pads PD1 and the second signal pads PD2 (refer to FIG. 2A) that are arranged in the second direction D2.

Figure 7B:
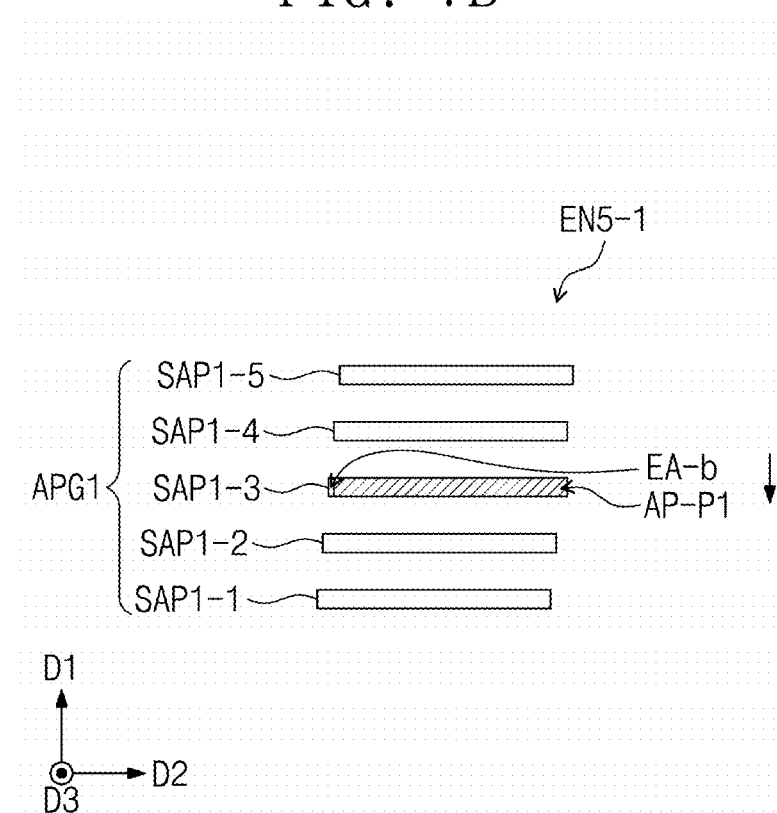
FIG. 7B is an enlarged view showing a portion EN5-1 in which first alignment pads overlap a first fixing pad of the display device of FIG. 7A.
Figure 7C:
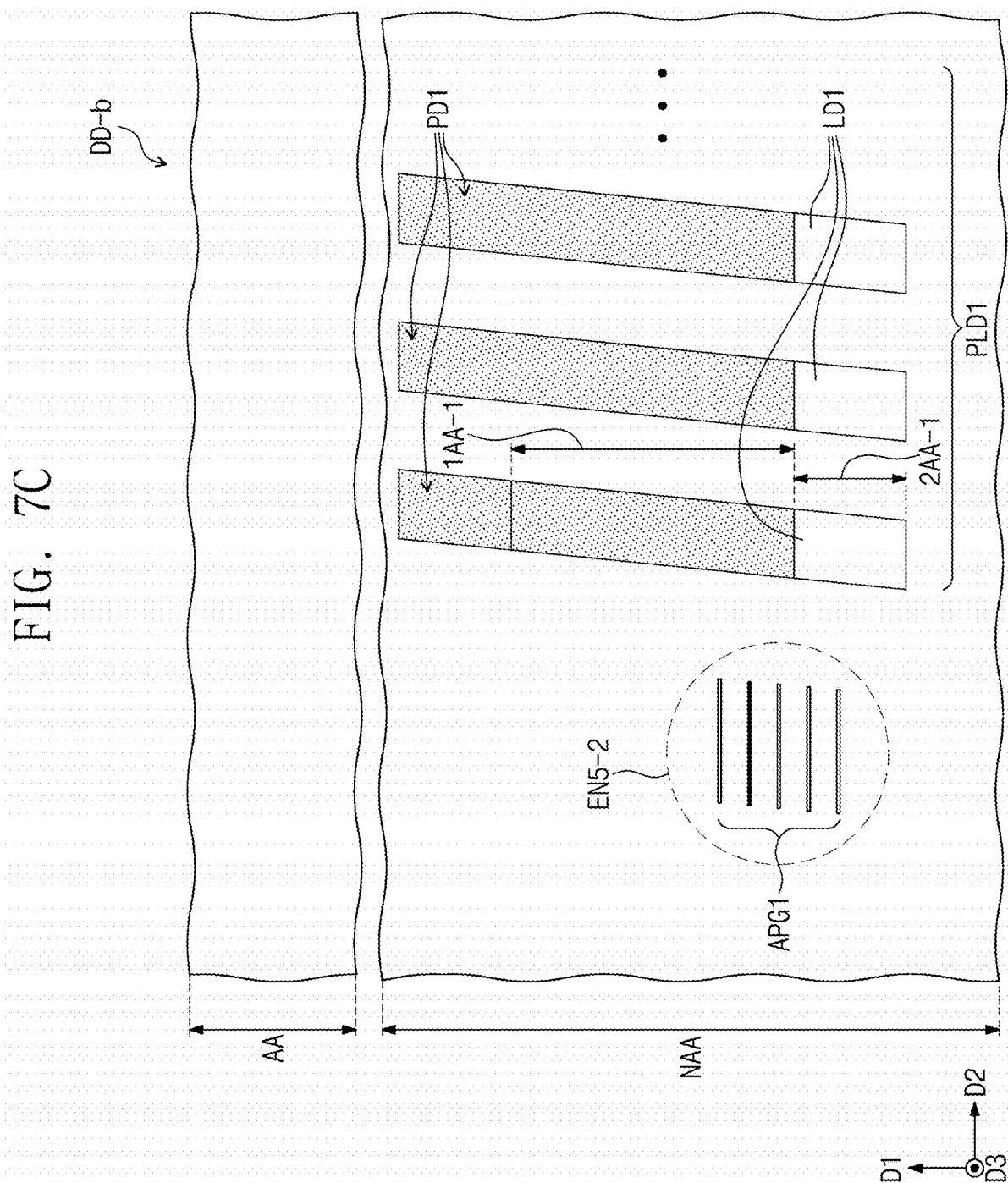
FIG. 7C is an enlarged view showing the display device after alignment.
Figure 7D:
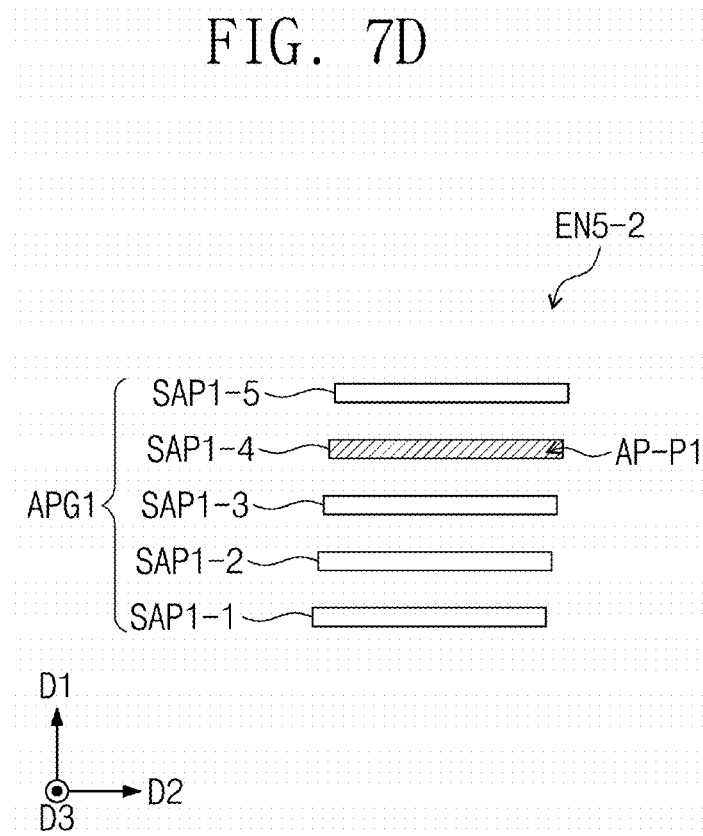
FIG. 7D is an enlarged view showing a portion EN5-2 in which the first alignment pads overlap the first fixing pad of the display device of FIG. 7C.

FIG. 7A is an enlarged view showing a display device before alignment. FIG. 7B is an enlarged view showing a portion EN5-1 in which first alignment pads overlap a first fixing pad of the display device of FIG. 7A. FIG. 7C is an enlarged view showing the display device after alignment. FIG. 7D is an enlarged view showing a portion EN5-2 in which the first alignment pads overlap the first fixing pad of the display device of FIG. 7C. Hereinafter, the display device DD-b' will be described in detail with reference to FIGS. 7A to 7D. Hereinafter, any repetitive detailed description of the same elements in FIGS. 7A to 7D as those of FIGS. 1A to 1C, 2A to 2D, 3A, 3B, 4, 5A, 5B, and 6A to 6D will be omitted, and different features from those of FIGS. 1A to 1C, 2A to 2D, 3A, 3B, 4, 5A, 5B, and 6A to 6D will be mainly described.

Referring to FIGS. 7A to 7D, an embodiment of the display device DD-b' may include a first portion 1AA-1 in which a first connection pad LD1 overlaps a signal pad PD and a second portion 2AA-1 in which the first connection pad LD1 does not overlap the signal pad PD, and a first fixing pad AP-P1 may overlap one of fourth and fifth first alignment pads SAP1-4 and SAP1-5 rather than a third first alignment pad SAP1-3 of a first alignment pad group APG1. In such an embodiment, differently from that of FIGS. 6A to 6D, the first portion 1AA-1 may be closer to the display area AA than the second portion 2AA-1 is.

Referring to FIGS. 7A and 7B, when a flexible film BF (refer to FIG. 2A) is disposed on a display panel DP (refer to FIG. 2A) of the display device DD-a' before alignment, the first connection pad LD1 may include an overlap area SAA-1 that overlaps the signal pad PD and a non-overlap area EAA-1 that does not overlap the signal pad PD. The non-overlap area EAA-1 may be closer to the first alignment pad group APG1 than the overlap area SAA-1 is.

The third first alignment pad SAP1-3 of the first alignment pad group APG1 may include a non-overlap portion EA-b that does not overlap the first fixing pad AP-P1. The overlap portion (not shown) may be closer to the first connection pad LD1 than the non-overlap portion EA-b is. A distance L3 (refer to FIG. 3B) between the third first alignment pad SAP1-3 and the third second alignment pad SAP2-3 (refer to FIG. 3B), which serve as the reference pads, may be greater than a distance Lp (refer to FIG. 4) between the first fixing pad AP-P1 and the second fixing pad AP-P2 (refer to FIG. 4).

Referring to FIGS. 7C and 7D, the flexible film BF may move in a direction farther away from a display area AA (refer to FIG. 2A) in the first direction D1 to correct a misalignment between the first connection pad LD1 and the signal pad PD in FIGS. 7A and 7B such that the first fixing pad AP-P1 entirely overlaps the fourth first alignment pad SAP1-4. When the flexible film BF moves in a way such that the first fixing pad AP-P1 overlaps the fourth first alignment pad SAP1-4, the first connection pad LD1 may include a first portion 1AA-1 that entirely overlaps the signal pad PD and a second portion 2AA-1 that does not overlap the signal pad PD. The second portion 2AA-1 may be farther away from the display area AA (refer to FIG. 2A) in the first direction D1 than the first portion 1AA-1 is.

In such an embodiment, when the overlap portion (not shown) in which the third first alignment pad SAP1-3 overlaps the first fixing pad AP-P1 is disposed to be closer to the first connection pad LD1 than the non-overlap portion EA-b is, the flexible film BF may move in the direction farther away from the display area AA in the first direction D1 to allow the first fixing pad AP-P1 to entirely overlap one of the fourth and fifth first alignment pads SAP1-4 and SAP1-5. Accordingly, the signal pad PD and the first connection pad LD1 may entirely overlap each other without separately measuring a length of all the first connection pads LD1 and the second connection pads LD2 (refer to FIG. 2A) that are arranged in the second direction D2 and a length of all the first signal pads PD1 and the second signal pads PD2 (refer to FIG. 2A) that are arranged in the second direction D2.

According to an embodiment, the display panel may include the first fixing pad and the second fixing pad, and the flexible film may include the first alignment pads and the second alignment pads, which are arranged such that the distance in the second direction between the first and second alignment pads decreases as the distance from the display area decreases. The overlap relationship between the signal pads and the connection pads may be checked based on the overlap relationship between the fixing pads and the k-th alignment pads, which serve as the reference pads, among the alignment pads, and thus, the display panel and the flexible film may be aligned with each other without separately measuring the length of all the first connection pads and the second connection pads that are arranged in the second direction D2 and the length of all the first signal pads and the second signal pads that are arranged in the second direction D2.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel in which a display area and a non-display area are defined, wherein the display panel comprises:
    a plurality of first signal pads disposed in the non-display area, inclined with respect to an imaginary center axis extending in a first direction, and disposed at one side of the imaginary center axis;
    a plurality of second signal pads disposed in the non-display area, inclined with respect to the imaginary center axis, and disposed at the other side of the imaginary center axis, a first fixing pad; and
    a second fixing pad spaced apart from the first fixing pad with the first and second signal pads interposed therebetween in a second direction substantially perpendicular to the first direction; and
a flexible film comprising:
    a plurality of first connection pads overlapping the first signal pads;
    a plurality of second connection pads overlapping the second signal pads;
    a first alignment pad group; and
    a second alignment pad group spaced apart from the first alignment pad group with the first and second connection pads interposed therebetween in the second direction,
wherein
the first alignment pad group comprises n first alignment pads arranged in the first direction,
the second alignment pad group comprises n second alignment pads corresponding to the first alignment pads,
a distance between corresponding first and second alignment pads decreases as a distance thereof from the display area decreases,
the first fixing pad overlaps one of the n first alignment pads,
the second fixing pad overlaps one of the n second alignment pads,
n is an integer equal to or greater than 3.

2. The display device of claim 1, wherein
the first connection pads entirely overlap the first signal pads, and
the second connection pads entirely overlap the second signal pads.

3. The display device of claim 1, wherein
an inclination of an imaginary line which connects ends of the first alignment pads adjacent to the imaginary center axis corresponds to an inclined angle of the first connection pads, and
an inclination of an imaginary line which connects ends of the second alignment pads adjacent to the imaginary center axis corresponds to an inclined angle of the second connection pads.

4. The display device of claim 1, wherein the first alignment pads are symmetrical with the second alignment pads with respect to the imaginary center axis.

5. The display device of claim 1, wherein the distance between the corresponding first and second alignment pads sequentially decreases with a tolerance equal to or greater than about 3 micrometers and equal to or less than about 4 micrometers as the distance thereof from the display area decreases.

6. The display device of claim 1, wherein
the first fixing pad and the second fixing pad overlap a k-th first alignment pad and a k-th second alignment pad, respectively,
the first signal pads entirely overlap the first connection pads, respectively,
the second signal pads entirely overlap the second connection pads, respectively, and
k is an integer equal to or greater than 2 and equal to or less than n.

7. The display device of claim 6, wherein a distance in the second direction between the k-th first alignment pad and the k-th second alignment pad corresponds to a distance in the second direction between the first fixing pad and the second fixing pad.

8. The display device of claim 1, wherein
the first fixing pad and the second fixing pad overlap a (k+a)-th first alignment pad and a (k+a)-th second alignment pad, respectively, the first signal pads comprise a first portion which overlaps the first connection pads and a second portion which does not overlap the first connection pads, the second signal pads comprise a first portion which overlaps the second connection pads and a second portion which does not overlap the second connection pads, the second portion of the first and second signal pads is closer to the display area than the first portion of the first and second signal pads is, the k is an integer equal to or greater than 2 and equal to or less than n, and a is an integer equal to or greater than 1 and equal to or less than n-k.

9. The display device of claim 8, wherein a distance in the second direction between a k-th first alignment pad and a k-th second alignment pad is less than a distance in the second direction between the first fixing pad and the second fixing pad.

10. The display device of claim 1, wherein
the first fixing pad and the second fixing pad overlap a (k-a)-th first alignment pad and a (k-a)-th second alignment pad, respectively, the first signal pads comprise a first portion which overlaps the first connection pads and a second portion which does not overlap the first connection pads, the second signal pads comprise a first portion which overlaps the second connection pads and a second portion which does not overlap the second connection pads, the first portion of the first and second signal pads is closer to the display area than the second portion of the first and second signal pads is, k is an integer equal to or greater than 2 and equal to or less than n, and a is an integer equal to or greater than 1 and equal to or less than k-1.

11. The display device of claim 10, wherein a distance in the second direction between a k-th first alignment pad and a k-th second alignment pad is greater than a distance in the second direction between the first fixing pad and the second fixing pad.

12. The display device of claim 1, further comprising:
a conductive adhesive layer disposed between the display panel and the flexible film.

13. The display device of claim 11, wherein
each of the first alignment pads and the second alignment pads have a rectangular shape having a first side with a first length in the first direction and a second side with a second length in the second direction, the first fixing pad has a rectangular shape corresponding to each of the first alignment pads, and the second fixing pad has a rectangular shape corresponding to each of the second alignment pads.

14. The display device of claim 13, wherein
the first alignment pads adjacent to each other are spaced apart from each other in the first direction by the first length, and the second alignment pads adjacent to each other are spaced apart from each other in the first direction by the first length.

15. The display device of claim 1, wherein
the first signal pads and the first connection pads are inclined at an angle equal to or greater than about 5 degrees and equal to or less than about 10 degrees with respect to the imaginary center axis, and the second signal pads and the second connection pads are inclined at an angle equal to or greater than about 5 degrees and equal to or less than about 10 degrees with respect to the imaginary center axis.

16. A display device comprising:
a display panel, in which a display area and a non-display area are defined, wherein the display panel comprises:
a plurality of first signal pads disposed in the non-display area, inclined at an inclination angle ($\theta$) with respect to an imaginary center axis extending in a first direction, and disposed at one side of the imaginary center axis;

a plurality of second signal pads disposed in the non-display area, inclined at the inclination angle ($\theta$) with respect to the imaginary center axis, and disposed at the other side of the imaginary center axis;

a first fixing pad; and a second fixing pad spaced apart from the first fixing pad with the first and second signal pads interposed therebetween; and a flexible film comprising:

a plurality of first connection pads inclined at the inclination angle ($\theta$) with respect to the imaginary center axis and disposed at one side of the imaginary center axis;

a plurality of second connection pads inclined at the inclination angle ($\theta$) with respect to the imaginary center axis and disposed at the other side of the imaginary center axis;

a first alignment pad group; and a second alignment pad group spaced apart from the first alignment pad group with the first and second connection pads interposed therebetween, wherein the first alignment pad group comprises n first alignment pads which are sequentially arranged toward the display area and spaced apart from each other at a first distance and have a first length in the first direction, the second alignment pad group comprises n second alignment pads corresponding to the first alignment pads and having the first length in the first direction, a second distance between an m-th first alignment pad and an m-th second alignment pad and a third distance between an (m-1)-th first alignment pad and an (m-1)-th second alignment pad satisfy the following equation: $\tan\theta=((d-c)/2)/(a+b)$, wherein a denotes the first distance, b denotes the first length, c denotes the second distance between the m-th first alignment pad and the m-th second alignment pad, and d denotes the third distance between the (m-1)-th first alignment pad and the (m-1)-th second alignment pad, and n is an integer equal to or greater than 3, and m is an integer equal to or greater than 2 and equal to or less than n.

17. The display device of claim 16, wherein the second distance is less than the third distance.

18. The display device of claim 16, wherein
the first fixing pad overlaps a k-th first alignment pad, and
the second fixing pad overlaps a k-th second alignment pad corresponding to the k-th first alignment pad,
wherein k is an integer equal to or greater than 1 and equal to or less than n.

* * * * *